US012599044B2

(12) United States Patent
Chung et al.

(10) Patent No.: US 12,599,044 B2
(45) Date of Patent: Apr. 7, 2026

(54) DISPLAY MODULE AND DISPLAY DEVICE

(71) Applicant: SAMSUNG ELECTRONICS CO., LTD., Suwon-si (KR)

(72) Inventors: Changkyu Chung, Suwon-si (KR); Tackmo Lee, Suwon-si (KR); Kyungwoon Jang, Suwon-si (KR); Gyun Heo, Suwon-si (KR); Soonmin Hong, Suwon-si (KR); Daesuck Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 425 days.

(21) Appl. No.: 18/121,939

(22) Filed: Mar. 15, 2023

(65) Prior Publication Data

US 2023/0223388 A1     Jul. 13, 2023

Related U.S. Application Data

(63) Continuation of application No. PCT/KR2021/011734, filed on Sep. 1, 2021.

(30) Foreign Application Priority Data

Oct. 30, 2020     (KR) ........................ 10-2020-0143755

(51) Int. Cl.
H01L 29/20          (2006.01)
H01L 25/075         (2006.01)
(Continued)

(52) U.S. Cl.
CPC ........ H01L 25/167 (2013.01); H01L 25/0753 (2013.01)

(58) Field of Classification Search
CPC ... H10H 20/00–882; H10H 29/00–142; H10H 29/30–962; H01L 25/167; H01L 25/0753; G09G 2300/0426; G09G 3/32
See application file for complete search history.

(56) References Cited

U.S. PATENT DOCUMENTS

| | | |
|---|---|---|
| 8,619,008 B2 | 12/2013 | Cok |
| 9,286,826 B2 | 3/2016 | Wright et al. |

(Continued)

FOREIGN PATENT DOCUMENTS

| | | |
|---|---|---|
| CN | 208767335 U | 4/2019 |
| CN | 209447798 U | 9/2019 |

(Continued)

OTHER PUBLICATIONS

International Search Report (PCT/ISA/210) issued Dec. 17, 2021 by the International Searching Authority in International Patent Application No. PCT/KR2021/011734.

(Continued)

*Primary Examiner* — Ismail A Muse
(74) *Attorney, Agent, or Firm* — Sughrue Mion, PLLC

(57) ABSTRACT

A display module including a plurality of pixels, according to an embodiment, may include: a first substrate: a plurality of inorganic light-emitting elements disposed on the upper surface of the first substrate; a plurality of micro pixel controllers disposed on the lower surface of the first substrate; and a driver IC which transmits driving signals to the plurality of micro pixel controllers, wherein each of the plurality of pixels includes two or more inorganic light-emitting elements among the plurality of inorganic light-emitting elements, and each of the plurality of micro pixel controllers controls two or more pixels among the plurality of pixels.

15 Claims, 30 Drawing Sheets

(51) Int. Cl.
  *H01L 25/16*     (2023.01)
  *H01L 33/00*     (2010.01)

(56)         References Cited

U.S. PATENT DOCUMENTS

| | | | |
|---|---|---|---|
| 9,367,094 | B2 | 6/2016 | Bibl et al. |
| 10,483,253 | B1 | 11/2019 | Hu |
| 10,832,615 | B2 | 11/2020 | Kim et al. |
| 10,964,868 | B2 | 3/2021 | Song |
| 11,201,202 | B2 | 12/2021 | Kim et al. |
| 11,239,122 | B2 | 2/2022 | Jung et al. |
| 11,308,831 | B2 | 4/2022 | Jung et al. |
| 2018/0226386 | A1 | 8/2018 | Cok |
| 2019/0096864 | A1* | 3/2019 | Huitema ............... H01L 21/561 |
| 2019/0371232 | A1 | 12/2019 | Kim et al. |
| 2020/0020676 | A1* | 1/2020 | Cok ...................... H01L 25/167 |
| 2020/0194516 | A1* | 6/2020 | Kim ................... G06V 40/1306 |
| 2020/0320939 | A1 | 10/2020 | Ma et al. |
| 2021/0005588 | A1 | 1/2021 | Chung et al. |
| 2021/0183833 | A1* | 6/2021 | Hu ........................ H01L 25/167 |

FOREIGN PATENT DOCUMENTS

| | | |
|---|---|---|
| CN | 110649010 A | 1/2020 |
| KR | 10-2008-0078263 A | 8/2008 |
| KR | 10-2014-0092363 A | 7/2014 |
| KR | 10-1641168 B1 | 7/2016 |
| KR | 10-1820258 B1 | 1/2018 |
| KR | 10-2019-0072196 A | 6/2019 |
| KR | 10-2019-0137658 A | 12/2019 |
| KR | 10-2020-0004688 A | 1/2020 |
| KR | 10-2020-0022626 A | 3/2020 |
| KR | 10-2020-0057198 A | 5/2020 |
| KR | 10-2020-0076581 A | 6/2020 |
| KR | 10-2114406 B1 | 6/2020 |
| KR | 10-2020-0106929 A | 9/2020 |
| KR | 10-2020-0111561 A | 9/2020 |
| KR | 10-2020-0111924 A | 10/2020 |
| WO | 2019/168763 A1 | 9/2019 |

OTHER PUBLICATIONS

Written Opinion (PCT/ISA/237) issued Dec. 17, 2021 by the International Searching Authority in International Patent Application No. PCT/KR2021/011734.

European Extended Search Report issued Dec. 11, 2023 by the European Patent Office for EP Patent Application No. 21886530.1.

Communication dated Jan. 20, 2025, issued by the Korean Patent Office in Korean Application No. 10-2020-0143755.

Communication dated Jun. 30, 2025 issued by the European Patent Office in European Patent Application No. 21886530.1.

\* cited by examiner

<u>1</u>

DISPLAY MODULE AND DISPLAY DEVICE

CROSS-REFERENCE TO RELATED APPLICATION(S)

This application is a Bypass Continuation Application of PCT International Application No.PCT/KR2021/011734, filed on Sep. 1, 2021, which is based on and claims priority to Korean Patent Application No. 10-2020-0143755, filed on Oct. 30, 2020, in the Korean Intellectual Property Office, the disclosure of which is incorporated by reference herein in its entirety.

BACKGROUND

1. Field

The present disclosure relates to a display module and a display device for implementing an image by using an inorganic light emitting device.

2. Description of the Related Art

Display devices are classified into self-emissive displays in which pixels themselves emit light and non-emissive displays requiring a separate light source.

A Liquid Crystal Display (LCD), which is a representative non-emissive display, has a complex structure and is limited in implementing a thin thickness, because it requires a backlight unit supplying light from behind the display panel, a liquid crystal layer functioning as a switch for transmitting/blocking light, a color filter for changing supplied light to a desired color, etc.

In contrast, a self-emissive display in which a light emitting device is included in each pixel and each pixel itself emits light has a simple structure and achieves a high degree of design freedom because it does not require components, such as a backlight unit, a liquid crystal layer, etc. and also omits a color filter. Also, the self-emissive display implements an excellent contrast ratio, brightness, and viewing angle, as well as implementing a thin thickness.

A micro LED display among self-emissive displays is one of flat panel displays, and configured with a plurality of LEDs each having a size of about 100 micrometers. Compared to the LCD requiring a backlight, the micro LED display provides excellent contrast, response time, and energy efficiency.

Also, the micro LED which is an inorganic light emitting device has higher brightness, more excellent light-emitting efficiency, and a longer lifespan than OLEDs requiring an encapsulation layer for protecting organic materials.

SUMMARY

An aspect of the disclosure provides a display module capable of facilitating circuit testing, circuit replacement, and a manufacturing method of a display module or a display device by providing a thin film transistor circuit for driving an inorganic light emitting device mounted on a panel substrate in a separate chip, a display device, and a method for manufacturing the display module.

A display module including a plurality of pixels, according to an embodiment, includes: a first substrate; a plurality of inorganic light-emitting devices disposed on an upper surface of the first substrate; a plurality of micro pixel controllers disposed on a lower surface of the first substrate; and a driver integrated chip (IC) configured to transfer a driving signal to the plurality of micro pixel controllers, wherein each of the plurality of pixels is configured with two or more inorganic light-emitting devices among the plurality of inorganic light-emitting devices, and each of the plurality of micro pixel controllers is configured to control two or more pixels of the plurality of pixels.

Each of the plurality of micro pixel controllers may switch a plurality of inorganic light-emitting devices configuring the two or more pixels and supply driving current to the plurality of inorganic light-emitting devices configuring the two or more pixels.

Each of the plurality of micro pixel controllers may include: a second substrate; and at least one thin film transistor disposed on the second substrate, wherein the at least one thin film transistor may switch a plurality of inorganic light-emitting devices configuring the two or more pixels and supply driving current to the plurality of inorganic light-emitting devices configuring the two or more pixels.

The at least one thin film transistor may include a Low Temperature Polycrystalline Silicon (LTPS) thin film transistor.

The first substrate may include a glass substrate, and the second substrate may include a silicon substrate.

Spaces between adjacent pixels among the plurality of pixels may be the same.

Each of the plurality of micro pixel controllers may be disposed such that at least one part of the plurality of inorganic light-emitting devices overlaps at least one part of the micro pixel controller in an up-down direction.

Each of the plurality of pixels may include at least three sub pixels that output different colors of light.

Each of the plurality of pixels may include a red inorganic light-emitting device, a green inorganic light-emitting device, and a blue inorganic light-emitting device among the plurality of inorganic light-emitting devices.

Each of the plurality of micro pixel controllers may be electrically connected with a plurality of inorganic light-emitting devices configuring two or more pixels that are controlled by the micro pixel controller.

Each of the plurality of micro pixel controllers may be electrically connected with the plurality of inorganic light-emitting devices configuring the two or more pixels that are controlled by the micro pixel controller through at least one of a via hole wiring or a side wiring.

A display device according to an embodiment includes: a plurality of display modules including a plurality of pixels arranged two-dimensionally; and a frame supporting the plurality of display modules, wherein each of the plurality of display modules includes: a first substrate; a plurality of inorganic light-emitting devices disposed on an upper surface of the first substrate; a plurality of micro pixel controllers disposed on a lower surface of the first substrate; and a driver integrated chip (IC) configured to transfer a driving signal to the plurality of micro pixel controllers, each of the plurality of pixels is configured with two or more inorganic light-emitting devices among the plurality of inorganic light-emitting devices, and each of the plurality of micro pixel controllers is configured to control two or more pixels among the plurality of pixels.

Each of the plurality of micro pixel controllers may switch a plurality of inorganic light-emitting devices configuring the two or more pixels and supply driving current to the plurality of inorganic light-emitting devices configuring the two or more pixels.

Each of the plurality of micro pixel controllers may include: a second substrate; and at least one thin film transistor disposed on the second substrate, and the at least one thin film transistor may switch a plurality of inorganic light-emitting devices configuring the two or more pixels and supply driving current to the plurality of inorganic light-emitting devices configuring the two or more pixels.

The at least one thin film transistor may include a Low Temperature Polycrystalline Silicon (LTPS) thin film transistor.

The first substrate may include a glass substrate, and the second substrate may include a silicon substrate.

Spaces between adjacent pixels among the plurality of pixels may be the same.

Each of the plurality of micro pixel controllers may be disposed such that at least one part of the plurality of inorganic light-emitting devices overlaps at least one part of the micro pixel controller in an up-down direction.

Each of the plurality of pixels may include at least three sub pixels that output different colors of light.

Each of the plurality of pixels may include a red inorganic light-emitting device, a green inorganic light-emitting device, and a blue inorganic light-emitting device among the plurality of inorganic light-emitting devices.

Each of the plurality of micro pixel controllers may be electrically connected with a plurality of inorganic light-emitting devices configuring two or more pixels that are controlled by the micro pixel controller.

Each of the plurality of micro pixel controllers may be electrically connected with the plurality of inorganic light-emitting devices configuring the two or more pixels that are controlled by the micro pixel controller through at least one of a via hole wiring or a side wiring.

The frame may support edges of each of the plurality of display modules from a lower portion, and an area corresponding to inside of the edges of each of the plurality of display modules may open.

The plurality of micro pixel controllers disposed on the lower surface of the first substrate may be disposed at open areas of the frame.

The display device may further include a driving board configured to transmit a timing control signal to the plurality of display modules, and the driving board may be disposed below the frame and electrically connected with the plurality of display modules through the open areas of the frame.

By a display device and a manufacturing method thereof according to an aspect of the disclosure, it may be possible to facilitate circuit testing, circuit replacement, and a manufacturing method of a display module or a display device by providing a thin film transistor circuit for driving an inorganic light emitting device mounted on a panel substrate in a separate chip.

BRIEF DESCRIPTION OF DRAWINGS

The above and other aspects and features of certain embodiments of the present disclosure will be more apparent from the following description taken in conjunction with the accompanying drawings, in which.

DETAILED DESCRIPTION

Figure 1:
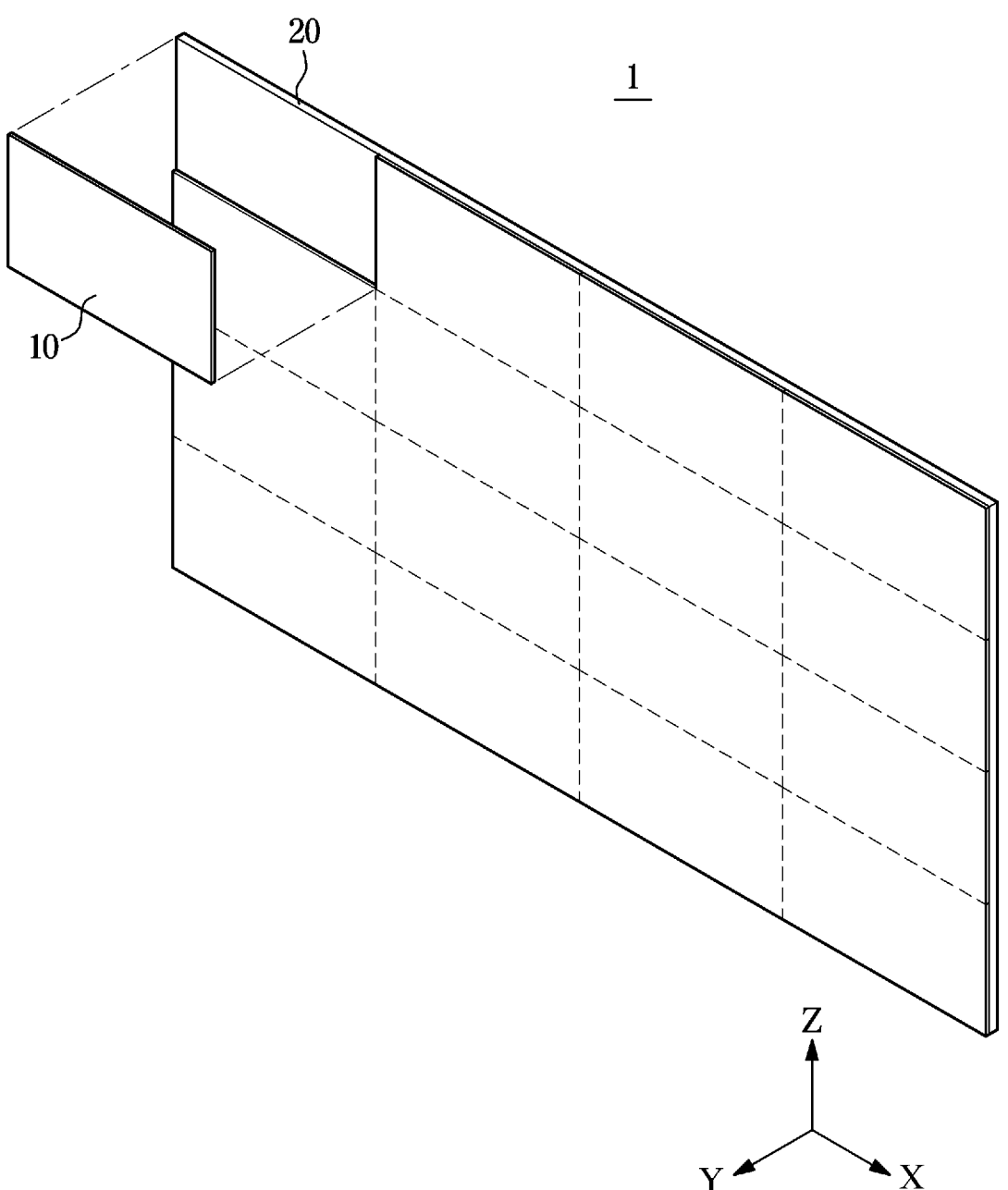
FIG. 1 is a perspective view showing an example of a display module according to an embodiment and a display device including the display module.

Like reference numerals will refer to like components throughout this specification. This specification does not describe all components of the embodiments, and general information in the technical field to which the present disclosure belongs or overlapping information between the embodiments will not be described. The terms "portion", "module", "element", and "block", as used herein, may be implemented as software or hardware, and according to embodiments, a plurality of "portions", "modules", "elements", and "blocks" may be implemented as a single component, or a single "portion", "module", "element", and "block" may include a plurality of components.

Throughout this specification, it will be understood that when a certain part is referred to as being "connected" to another part, it can be directly or indirectly connected to the other part. When a certain part is indirectly connected to another part, it may be connected to the other part through a wireless communication network or electrically connected to the other part by wiring, soldering, etc.

Also, it will be understood that when a certain part "includes" a certain component, the part does not exclude another component but can further include another component, unless the context clearly dictates otherwise.

In the entire specification, it will also be understood that when an element is referred to as being "on" or "over" another element, it can be directly on the other element or intervening elements may also be present.

In the entire specification, it will also be understood that when a certain component transfers or transmits a signal or data to another component, a case in which another component is present between the corresponding component and the other component and the corresponding component transfers or transmits the signal or data through the other component is not exclusive, unless the context clearly dictates otherwise.

In the entire specification, the ordinal terms "first", "second", etc. are used to distinguish a plurality of components from each other, without representing an arrangement order of the components, a manufacturing order of the components, importance of the components, etc.

It is to be understood that the singular forms "a," "an," and "the" include plural referents unless the context clearly dictates otherwise.

Reference numerals used in operations are provided to indicate the operations, without describing the order of the operations, and the operations may be executed in a different order from the stated order unless a specific order is definitely specified in the context.

Hereinafter, embodiments of a display module, a display device, and a manufacturing method thereof according to an aspect will be described in detail.

Figure 2:
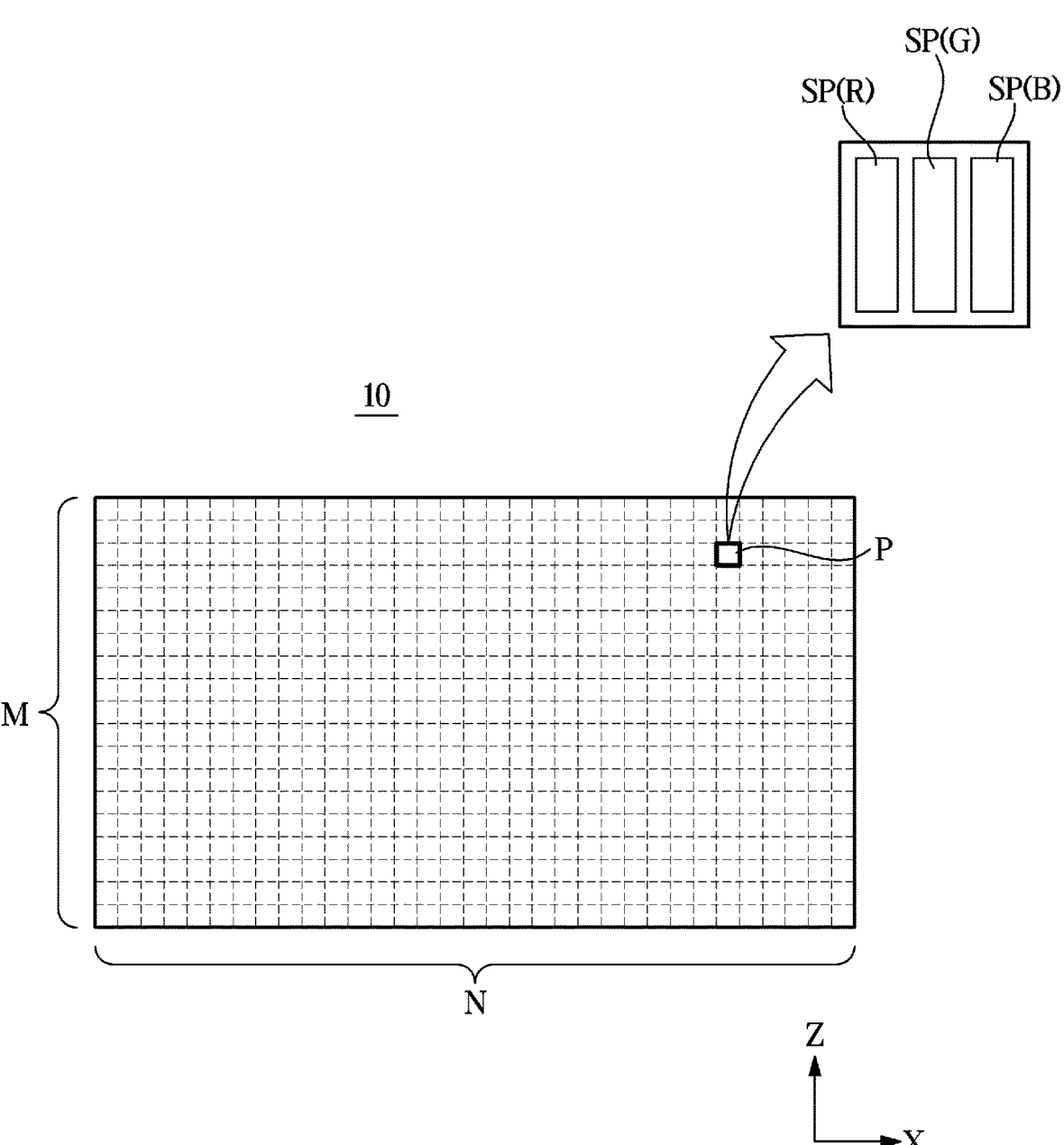
FIG. 2 shows an example of a pixel arrangement configuring a unit module of a display device according to an embodiment.

FIG. 1 is a perspective view showing an example of a display module according to an embodiment and a display device including the display module, and FIG. 2 shows an example of a pixel arrangement configuring a unit module of a display device according to an embodiment.

A display device according to an embodiment may be a self-emissive display device in which a light-emitting device is disposed in each pixel and each pixel itself emits light. Accordingly, because the display device does not require components, such as a backlight unit, a liquid crystal layer, etc., unlike a liquid crystal display, the display device may implement a thin thickness and have a simple structure to allow various changes of design.

Also, the display device according to an embodiment may adopt an inorganic light-emitting device such as Inorganic Light Emitting Diode as a light-emitting device disposed in each pixel. The inorganic light-emitting device may have high response speed and implement high brightness with low power compared to an organic light-emitting device such as Organic Light Emitting Diode (OLED).

Also, unlike organic light-emitting devices requiring an encapsulation process and having low durability because of being vulnerable to exposure to water and oxygen, inorganic light-emitting devices may require no encapsulation process and have high durability. Hereinafter, an inorganic light-emitting device mentioned in the following embodiments indicates an inorganic light-emitting diode.

An inorganic light-emitting diode that is adopted in a display device according to an embodiment may be a micro LED of which a shorter side has a length of about 10 μm. As such, by adopting micro-scale LEDs, a pixel size may be reduced, and high resolution may be implemented with the same screen size.

Also, by manufacturing a LED chip to a micro-scale size, a problem of being broken upon being bent due to properties of inorganic materials may be overcome. That is, upon transferring of a micro LED chip onto a flexible substrate, the LED chip may be prevented from being broken although the substrate is bent, and accordingly, a flexible display device may be implemented.

A display device adopting micro LEDs may be applied to various fields by using a micro-scale pixel size and a thin thickness. For example, as shown in FIG. 1, by tiling a plurality of display modules 10 to which a plurality of micro LEDs are transferred and fixing the plurality of display modules 10 to a housing 20, a large-scaled screen may be implemented, and a display device having such a large-scaled screen may be used for a signage, an electronic notice board, etc.

Meanwhile, a three-dimensional coordinate system having XYZ axes, as shown in FIG. 1, may be based on the display device 1, wherein a plane on which a screen of the display device 1 is positioned may be a XZ plane, and a direction in which an image is output or a light-emitting direction of inorganic light-emitting devices may be a +Y direction. Because the coordinate system is based on the display device 1, the same coordinate system may be applied to both a case in which the display device 1 lies and a case in which the display device 1 stands.

Because the display device 1 is used generally in a state of standing and a user watches images in front of the display device 1, the +Y direction in which images are output may be referred to as a front direction, and the opposite direction may be referred to as a rear direction.

Also, the display device 1 may be manufactured in a state of lying. Accordingly, a −Y direction of the display device 1 may be referred to as a lower direction, and the +Y direction may be referred to as an upper direction. That is, in the following embodiments, the +Y direction may be referred to as an upper direction or a front direction, and the −Y direction may be referred to as a lower direction or a rear direction.

The remaining four surfaces of the display device 1 or the display module 10 being in a shape of a flat plate, except for upper and lower surfaces of the display device 1 or the display module 10, may be referred to as side surfaces regardless of a position of the display device 1 or the display module 10.

In the example of FIG. 1, a case in which the display device 1 includes a plurality of display modules to implement a large-scaled screen is shown, although an embodiment of the display device 1 is not limited thereto. The display device 1 may include a single display module 10 to be implemented as a TV, a wearable device, a portable device, a monitor for PC, etc.

Referring to FIG. 2, the display module 10 may include a M×N (M and N are integers that are greater than or equal to 2) arrangement of pixels, that is, a plurality of pixels arranged two-dimensionally. FIG. 2 conceptually shows an arrangement of pixels, and the display module 10 may include a bezel area, a wiring area, etc. where no image is displayed, as well as an active area where pixels are arranged.

In the current embodiment, a case in which certain components are arranged two-dimensionally may include a case in which the corresponding components are disposed on the same plane and a case in which the corresponding components are disposed on different planes that are parallel to each other. Also, the case in which the corresponding components are disposed on the same plane may include a case in which upper ends of the disposed components are located on different planes being parallel to each other, not on the same plane.

Each pixel P may include three sub pixels that each output different colors of light. For example, each pixel P may include three sub pixels SP(R), SP(G), and SP(B) respectively corresponding to R, G, and B. The red sub pixel SP(R) may output red light, the green sub pixel SP(G) may output green light, and the blue sub pixel SP(B) may output blue light.

However, the pixel arrangement shown in FIG. 2 may be an example that may be applied to the display module 10 and the display device 1 according to an embodiment. The sub pixels may be arranged along a Z-axis direction, may be not aligned, or may have different sizes. For a pixel to implement various colors, the pixel may need to include a plurality of sub pixels without any limitation on the sizes or arrangement of the sub pixels.

A pixel may be not necessarily include a red sub pixel SP(R) outputting red light, a green sub pixel SP(G) outputting green light, and a blue sub pixel SP(B) outputting blue light, and the pixel may include a sub pixel outputting yellow light or white light. That is, colors or kinds of light output from the individual sub pixels and the number of the sub pixels are not limited.

However, in the following embodiments, for a detailed description, a case in which each pixel P includes a red sub pixel SP(R), a green sub pixel SP(G), and a blue sub pixel SP(B) will be described as an example.

As described above, the display module 10 and the display device 1 according to an embodiment may be self-emissive displays in which individual pixels themselves emit light. Accordingly, the respective sub pixels may include inorganic light emitting devices that emit different colors of light. For example, the red sub pixel SP(R) may include a red inorganic light-emitting device, the green sub pixel SP(G) may include a green inorganic light-emitting device, and the blue sub pixel SP(B) may include a blue inorganic light-emitting device.

Accordingly, in the current embodiment, each pixel P may be a cluster including a red inorganic light-emitting device, a green inorganic light-emitting device, and a blue inorganic light-emitting device, and each sub pixel may be an inorganic light-emitting device.

Figure 3:
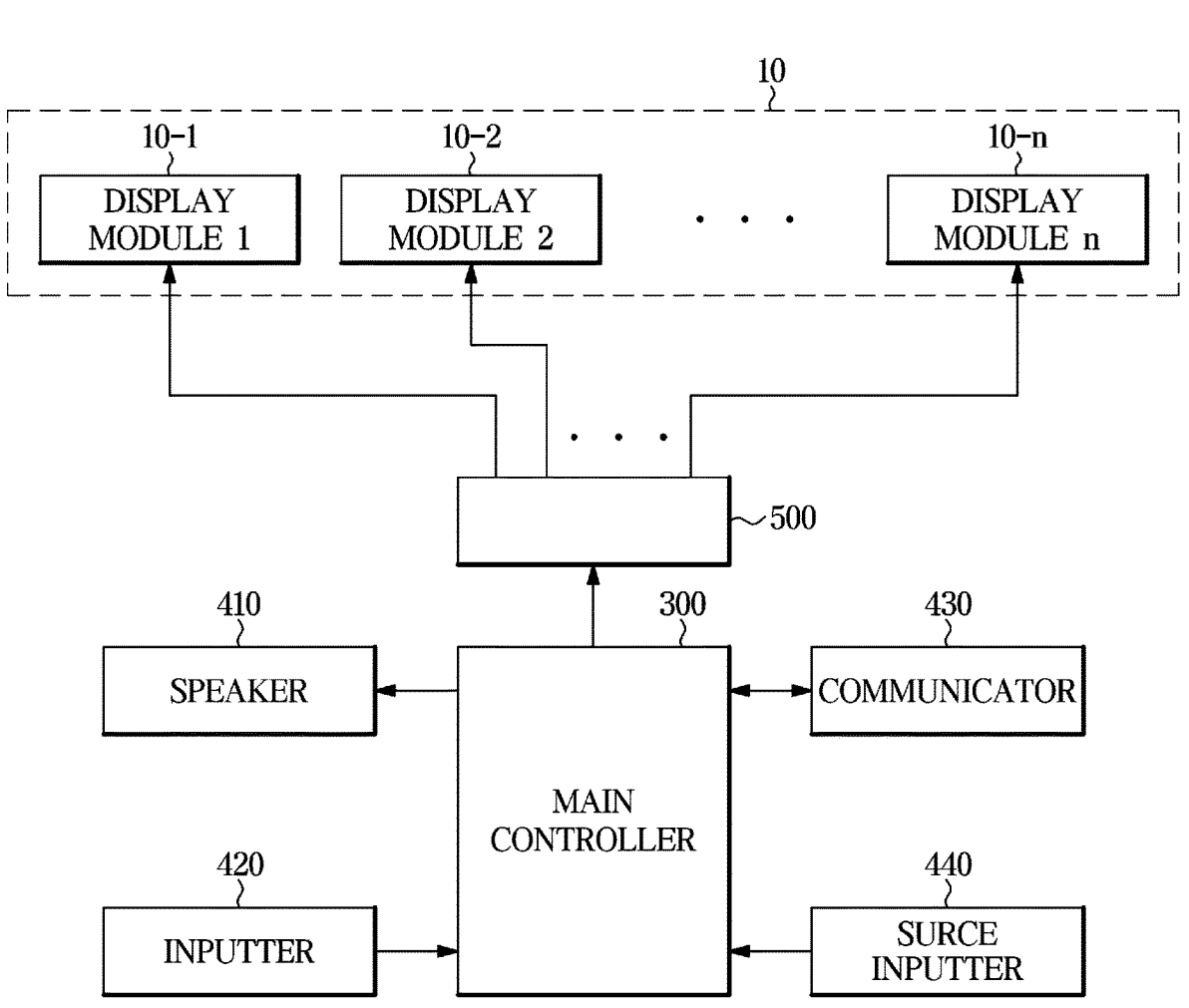
FIG. 3 is a control block diagram of a display device according to an embodiment.

FIG. 3 is a control block diagram of a display device according to an embodiment.

As described above with reference to FIG. 1, the display device 1 according to an embodiment may include a plurality of display modules 10-1, 10-2, . . . , 10-n, wherein n is an integer that is greater than or equal to 2, and the display device 1 may include a main controller 300 for controlling the plurality of display modules 10, a timing controller 500, a communicator 430 for communicating with an external device, a source inputter 440 for receiving a source image, a speaker 410 for outputting sound, and an inputter 420 for receiving a command for controlling the display device 1 from a user.

The inputter 420 may include a button or a touch pad provided in one area of the display device 1, and in a case in which a display panel 100 (see FIG. 4) is implemented as a touch screen, the inputter 420 may include a touch pad provided on a front surface of the display panel 100. Also, the inputter 420 may include a remote controller.

The inputter 420 may receive, from a user, various commands for controlling the display device 1, such as power on/off, volume control, channel adjustment, screen adjustment, various setting changes, etc.

The speaker 410 may be provided in an area of the housing 20, and further include a separate speaker module physically separated from the housing 20.

The communicator 430 may transmit and receive desired data by communicating with a relay server or another electronic device. The communicator 430 may adopt at least one of various wireless communication methods, such as 3Generation (3G), 4Generation (4G), wireless Local Area Network (WLAN), Wireless-Fidelity (Wi-Fi), Bluetooth, Zigbee, Wi-Fi Direct (WFD), Ultra wideband (UWB), Infra-red Data Association (IrDA), Bluetooth Low Energy (BLE), Near Field Communication (NFC), Z-Wave, etc. Also, the communicator 430 may adopt a wired communication method, such as Peripheral Component Interconnect (PCI), PCI-express, Universe Serial Bus (USB), etc.

The source inputter 440 may receive a source signal through a set-top box, a USB, an antenna, etc. Accordingly, the source inputter 440 may include at least one selected from a group of source input interfaces including a HDMI cable port, a USB port, an antenna port, etc.

The source signal received by the source inputter 440 may be processed by a main controller 330 to be converted into a form capable of being output on the display panel 100 and the speaker 410.

The main controller 300 and the timing controller 500 may include at least one memory storing various data and a program for performing an operation which will be described below, and at least one processor for executing the stored program.

The main controller 300 may generate an image signal corresponding to the source signal by processing the source signal received by the source inputter 440.

For example, the main controller 330 may include a source decoder, a scaler, an image enhancer, and a graphic processor. The source decoder may decode a source signal compressed in a format of Moving Picture Experts Group (MPEG), etc., and the scaler may output image data of desired resolution through resolution conversion.

The image enhancer may enhance image quality of image data by applying various correction techniques. The graphic processor may classify each pixel of image data into RGB data, and output the RGB data together with a control signal such as a syncing signal for display timing in the display panel 100. That is, the main controller 300 may output a control signal and image data corresponding to the source signal.

The above-described operations of the main controller 300 may be an example that is applicable to the display device 1, and the main controller 300 may further perform another operation or omit some of the above-described operations.

The image data and control signal output from the main controller 300 may be transferred to the timing controller 500.

The timing controller 500 may convert the image data transferred from the main controller 300 into a format of image data capable of being processed by a driver IC 200

(see FIG. 4), and generate various control signals, such as a timing control signal, etc., required for displaying the image data on the display panel 100.

However, the display device 1 according to an embodiment may not necessarily include the plurality of display modules 10, and in the following embodiment, for a detailed description, the display device 1 including the plurality of display modules 10 will be described as an example.

Figure 4:
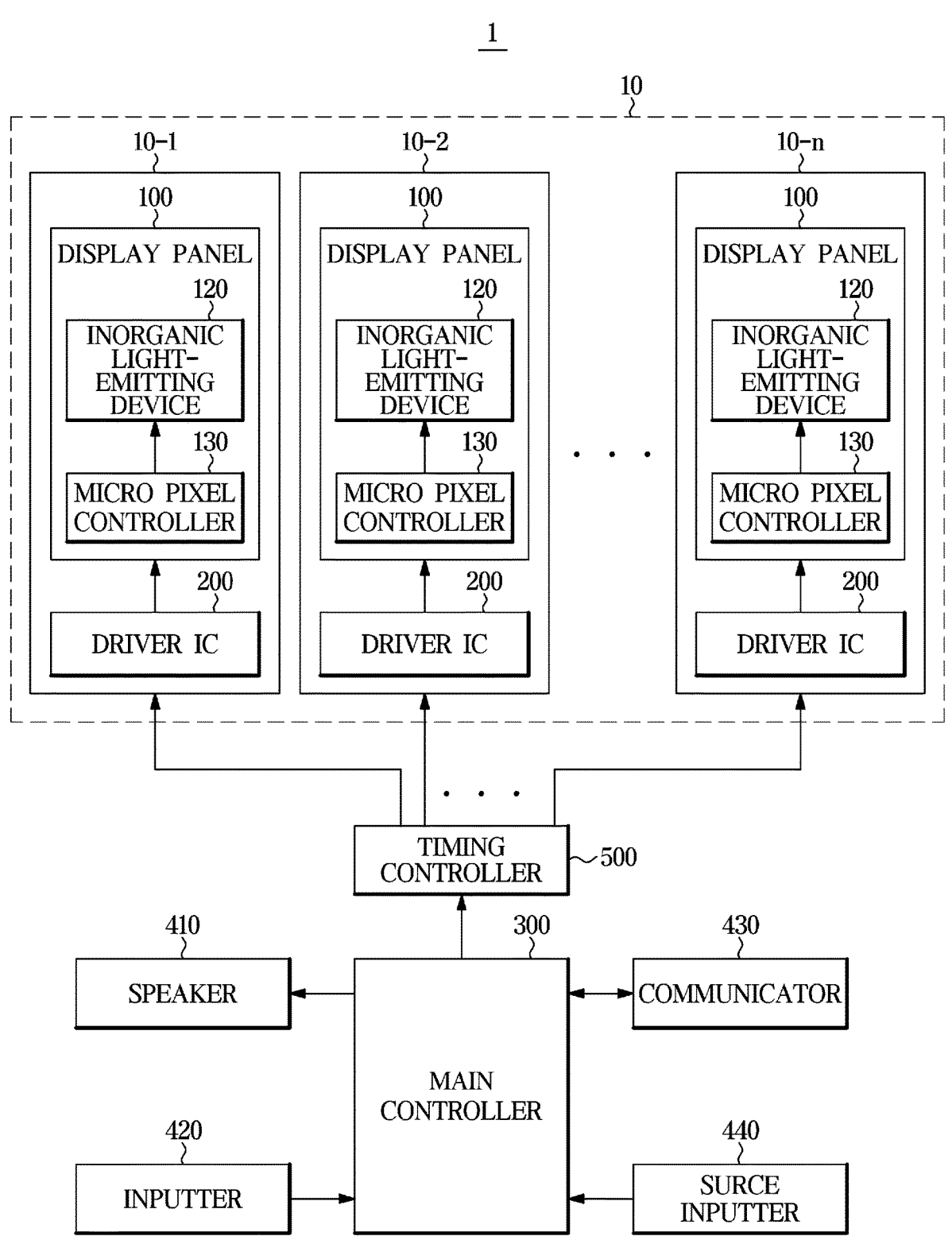
FIG. 4 is a control block diagram embodying a configuration of a display module included in a display device according to an embodiment.
Figure 5:
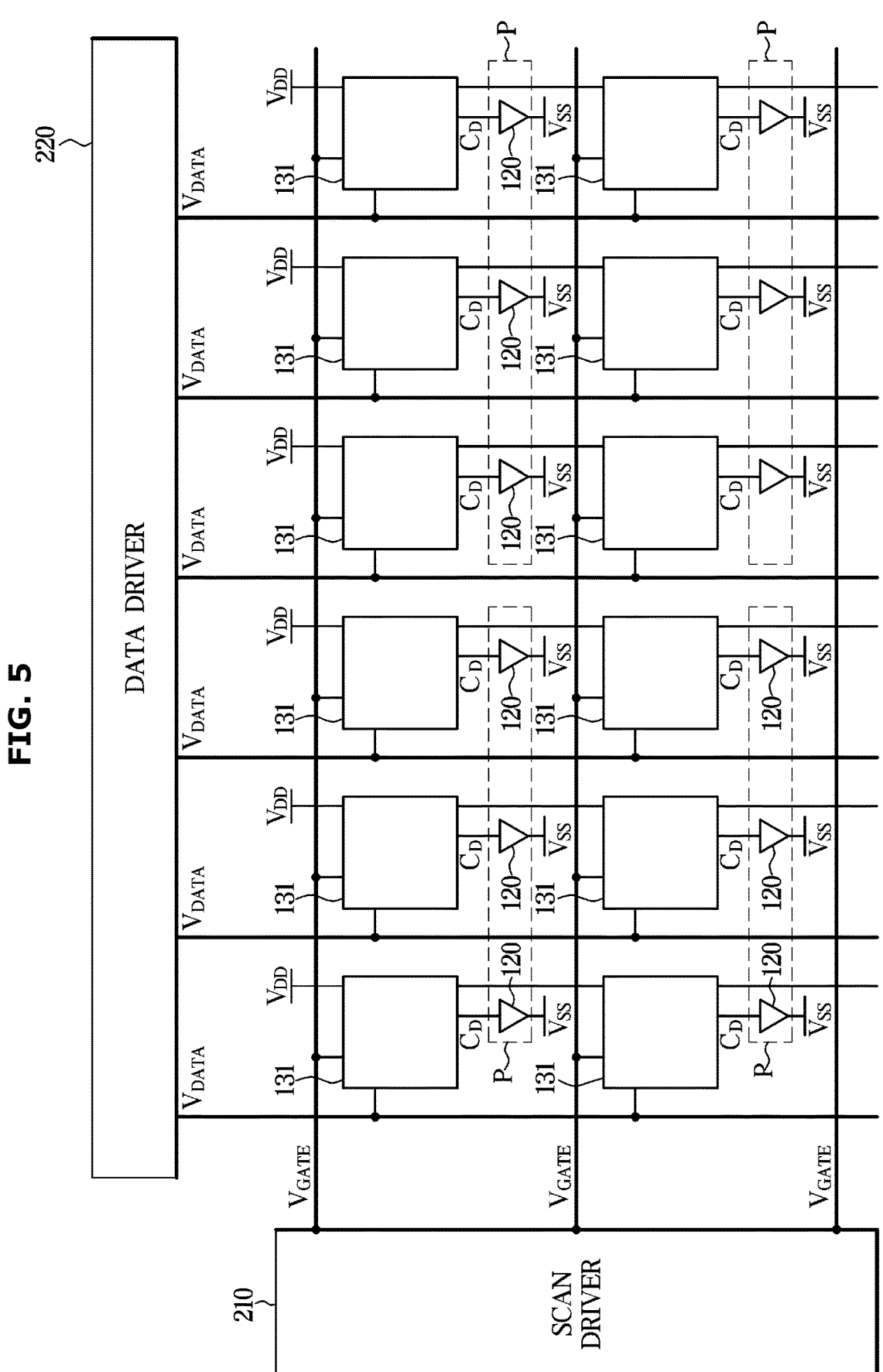
FIG. 5 is a view for conceptually describing a method in which individual pixels are driven in a display module according to an embodiment.

FIG. 4 is a control block diagram embodying a configuration of a display module included in a display device according to an embodiment, and FIG. 5 is a view for conceptually describing a method in which individual pixels are driven in a display module according to an embodiment.

Referring to FIG. 4, each of the plurality of display modules 10-1, 10-2, ... 10-$n$ may include the display panel 100 for displaying an image and the driver IC 200 for driving the display panel 100.

The display panel 100 may include a plurality of pixels arranged two-dimensionally, and each pixel may include a plurality of sub pixels for implementing various colors, as described above.

Also, as described above, the display device 1 according to an embodiment may be a self-emissive display device in which individual pixels themselves emit light. Accordingly, each sub pixel may include an inorganic light emitting device 120. That is, each of the plurality of pixels may include two or more inorganic light emitting devices 120.

Each inorganic light emitting device 120 may be driven by an Active Matrix (AM) method or a Passive Matrix (PM) method. In the following embodiment, for a detailed description, a case in which the inorganic light emitting device 120 is driven by the AM method will be described as an example.

In the display module 10 according to an embodiment, the individual inorganic light-emitting devices 120 may be controlled independently by a micro pixel controller 130, and the micro pixel controller 130 may operate based on a driving signal output from the driver IC 200.

Referring together to FIG. 5, the driver 1C 200 may include a scan driver 210 and a data driver 220. The scan driver 210 may output a gate signal for turning on/off a sub pixel, and the data driver 220 may output a data signal for implementing an image. However, according to various changes in design, some operations of the driver IC 200 may be performed by the micro pixel controller 130. For example, operations of the scan driver 210 may be performed by the micro pixel controller 130, and in this case, the driver IC 200 may not include the scan driver 210. In the following embodiment, for a detailed description, a case in which the driver IC 200 includes both the scan driver 210 and the data driver 220 will be described as an example.

The scan driver 210 may generate a gate signal based on a control signal transferred from the timing controller 500, and the data driver 220 may generate a data signal based on image data transferred from the timing controller 500.

The micro pixel controller 130 may include a pixel circuit 131 for individually controlling the inorganic light-emitting devices 120, and a gate signal output from the scan driver 210 and a data signal output from the data driver 220 may be input to the pixel circuit 131.

For example, according to inputs of a gate voltage $V_{GATE}$, a data voltage $V_{DATA}$, and a supply voltage $V_{DD}$ to the pixel circuit 131, the pixel circuit 131 may output driving current $C_D$ for driving the inorganic light-emitting devices 120.

The driving current $C_D$ output from the pixel circuit 131 may be input to the inorganic light-emitting devices 120, and the inorganic light-emitting devices 120 may emit light by the driving current $C_D$ to implement an image.

Figure 6:
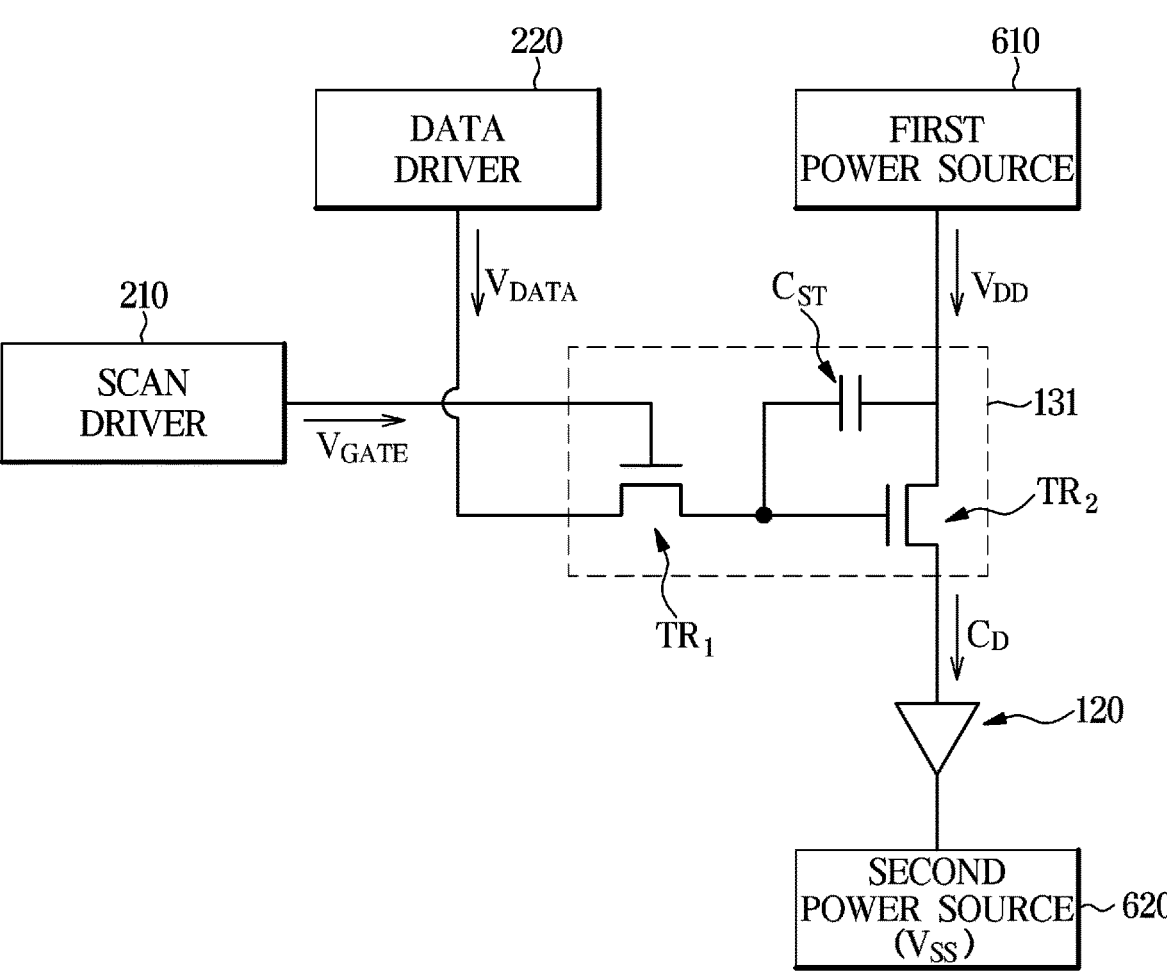
FIG. 6 is a circuit diagram briefly showing a pixel circuit for controlling a single sub pixel in a display module according to an embodiment.
Figure 7:
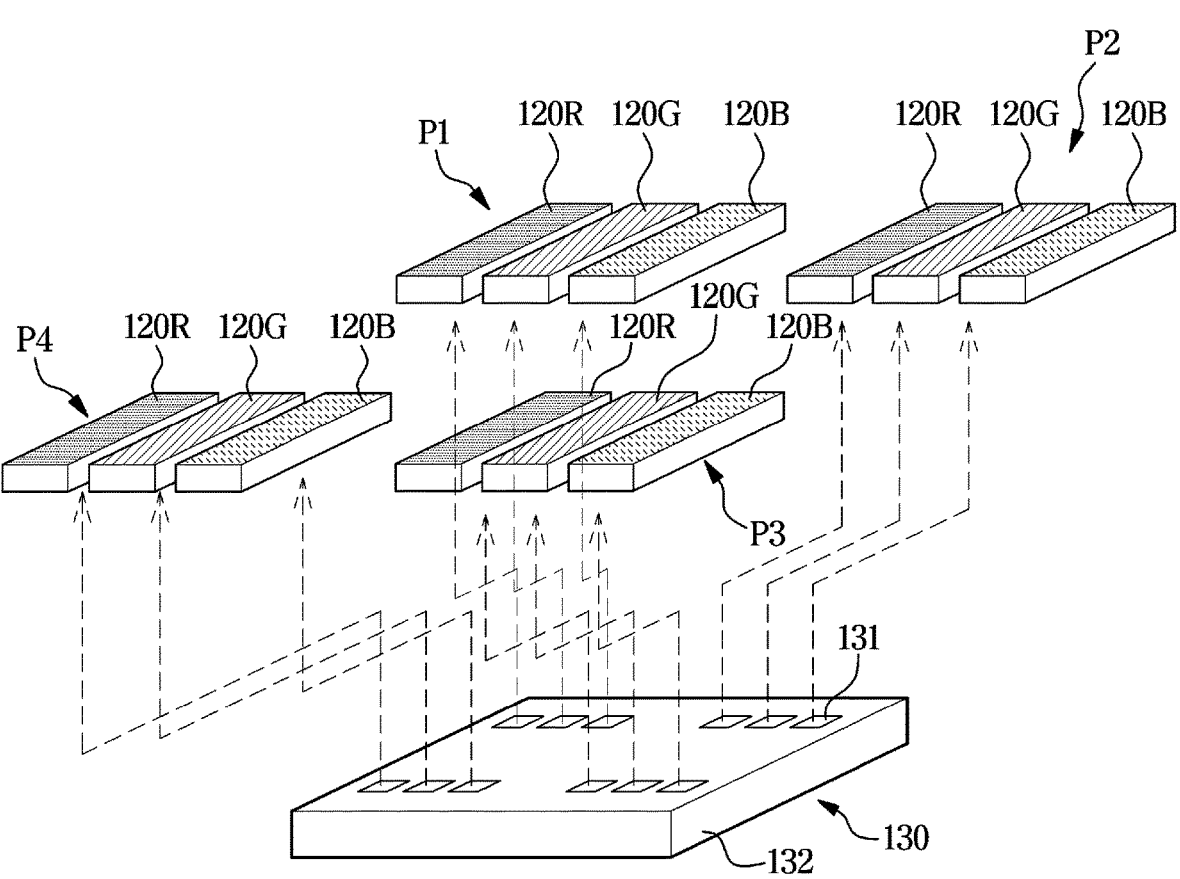
FIG. 7 conceptually shows a relationship between a micro pixel controller and pixels controlled by the micro pixel controller in a display module according to an embodiment.

FIG. 6 is a circuit diagram briefly showing a pixel circuit for controlling a single sub pixel in a display module according to an embodiment, and FIG. 7 conceptually shows a relationship between a micro pixel controller and pixels controlled by the micro pixel controller in a display module according to an embodiment.

Referring to an example of FIG. 6, the pixel circuit 131 may include a capacitor $C_{st}$ and thin film transistors $TR_1$ and $TR_2$ for switching or driving the inorganic light-emitting devices 120. As described above, each inorganic light-emitting device 120 may be a micro LED.

For example, the thin film transistors $TR_1$ and $TR_2$ may include a switching transistor $TR_1$ and a driving transistor $TR_2$, and the switching transistor $TR_1$ and the driving transistor $TR_2$ may be implemented as PMOS type transistors. An embodiment of the display module 10 and the display device 1 is not limited to this, and the switching transistor $TR_1$ and the driving transistor $TR_2$ may be implemented as NMOS type transistors.

A gate electrode of the switching transistor TR1 may be connected with the scan driver 210, a source electrode of the switching transistor TR1 may be connected with the data driver 220, and a drain electrode of the switching transistor TR1 may be connected with one end of the capacitor Cst and a gate electrode of the driving transistor TR2. The other end of the capacitor Cst may be connected with a first power source 610.

Also, a source electrode of the driving transistor $TR_2$ may be connected with the first power source 610 for supplying a supply voltage VDD, and a drain electrode of the driving transistor TR2 may be connected with an anode of the inorganic light-emitting device 120. A cathode of the inorganic light-emitting device 120 may be connected with a second power source 620 for supplying a reference voltage VSS. The reference voltage VSS may be a voltage having a lower level than the supply voltage VDD, and may be a ground voltage, etc. to provide a ground.

The pixel circuit 131 having the above-described structure may operate as follows. First, according to turning-on of the switching transistor $TR_1$ by application of a gate voltage $V_{GATE}$ from the scan driver 210, a data voltage $V_{DATA}$ applied from the data driver 220 may be transferred to one end of the capacitor Cm and the gate electrode of the driving transistor $TR_2$.

A voltage corresponding to a gate-source voltage $V_{GS}$ of the driving transistor $TR_2$ may be maintained for a preset time by the capacitor $C_{st}$. The driving transistor $TR_2$ may cause the inorganic light-emitting device 120 to emit light by applying driving current Ct) corresponding to the gate-source voltage $V_{GS}$ to the anode of the inorganic light-emitting device 120.

However, the above-described structure of the pixel circuit 131 may be an example that is applicable to the display module 10 according to an embodiment, and instead of the above-described example, various circuit structures for switching and driving the plurality of inorganic light-emitting devices 120 may be applied.

Also, the current embodiment may have any limitation on a method for controlling brightness of the inorganic light-emitting devices 120. The brightness of the inorganic light-emitting devices 120 may be controlled by one of various methods, such as a Pulse Amplitude Modulation (PAM) method, a Pulse Width Modulation (PWM) method, and a hybrid method being a combination of the PAM method and the PWM method.

Meanwhile, according to an embodiment of the display module 10, one micro pixel controller 130 may control a plurality of pixels. Controlling the pixels may mean controlling the plurality of inorganic light-emitting devices 120 configuring the pixels.

For example, as shown in FIG. 7, a micro pixel controller 130 may control four pixels P1, P2, P3, and P4. For this, a plurality of pixel circuits 131 for controlling the inorganic light-emitting devices 120 configuring the four pixels P1, P2, P3, and P4 may be provided on a second substrate 132 of the micro pixel controller 130.

The pixel circuits 131 may be provided by a number of the inorganic light-emitting devices 120 that are controlled by the micro pixel controller 130, and each pixel circuit 131 may control two or more inorganic light-emitting devices 120.

The second substrate 132 may be a silicon substrate, a glass substrate, or a plastic substrate. Because the micro pixel controller 130 does not include a light-emitting source such as an inorganic light-emitting device, a kind of the substrate may be selected without any limitation on the heat resistance of a material.

A thin film transistor formed on the second substrate 132 may be a Low Temperature Polycrystalline Silicon (LTPS) thin film transistor or an Oxide thin film transistor. Also, the thin film transistor may be an a-Si thin film transistor or a monocrystalline thin film transistor. However, in the current embodiment, for a detail description, a case in which the thin film transistor is a LTPS thin film transistor will be described as an example.

As described above, the second substrate 132 may be implemented as a silicon substrate. Because the silicon substrate has no limitation on electron mobility compared to a glass substrate, the second substrate 132 implemented as a silicon substrate may improve performance of the LTPS thin film transistor.

Meanwhile, according to an embodiment of the display module 10, circuit testing may be performed on each micro pixel controller 130, and only a micro pixel controller 130 identified as an adequate product by circuit testing may be installed in the display module 10. Accordingly, circuit testing and inadequate product replacement may be easy compared to a case in which a thin film transistor is mounted directly on a module substrate (a first substrate which will be described below).

Figure 8:
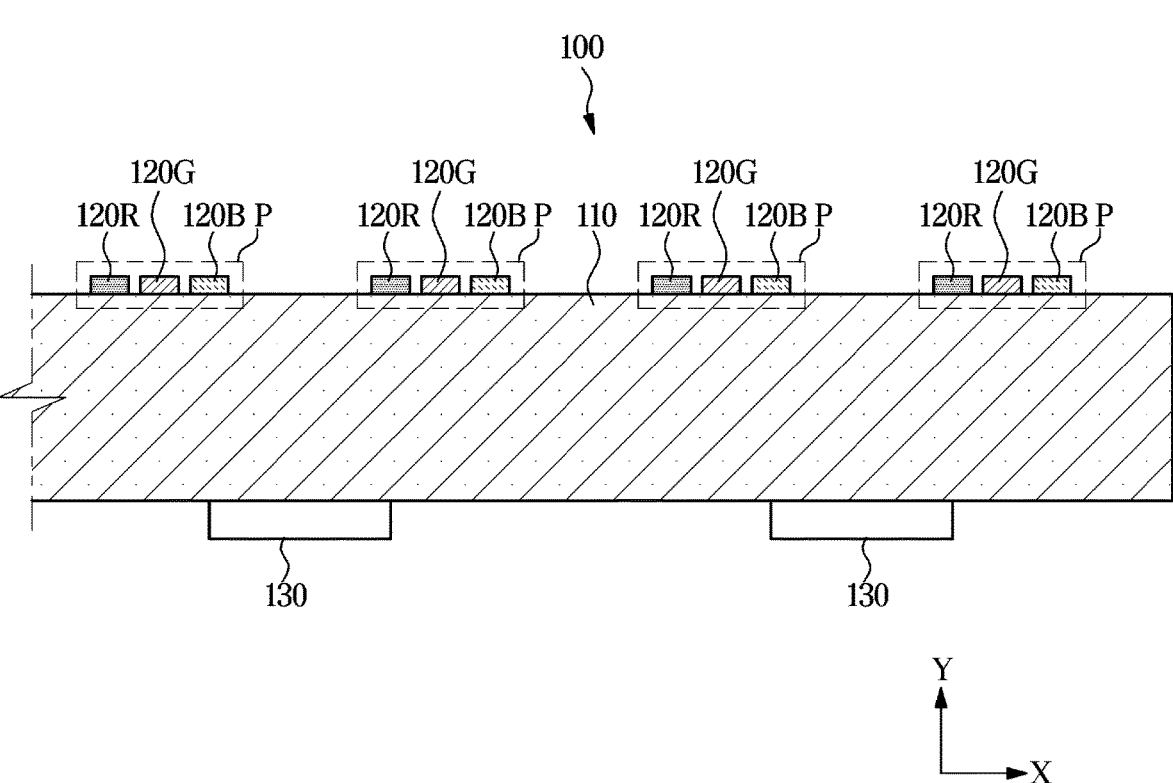
FIGS. 8 and 9 are side views of a part of a display module according to an embodiment.
Figure 9:
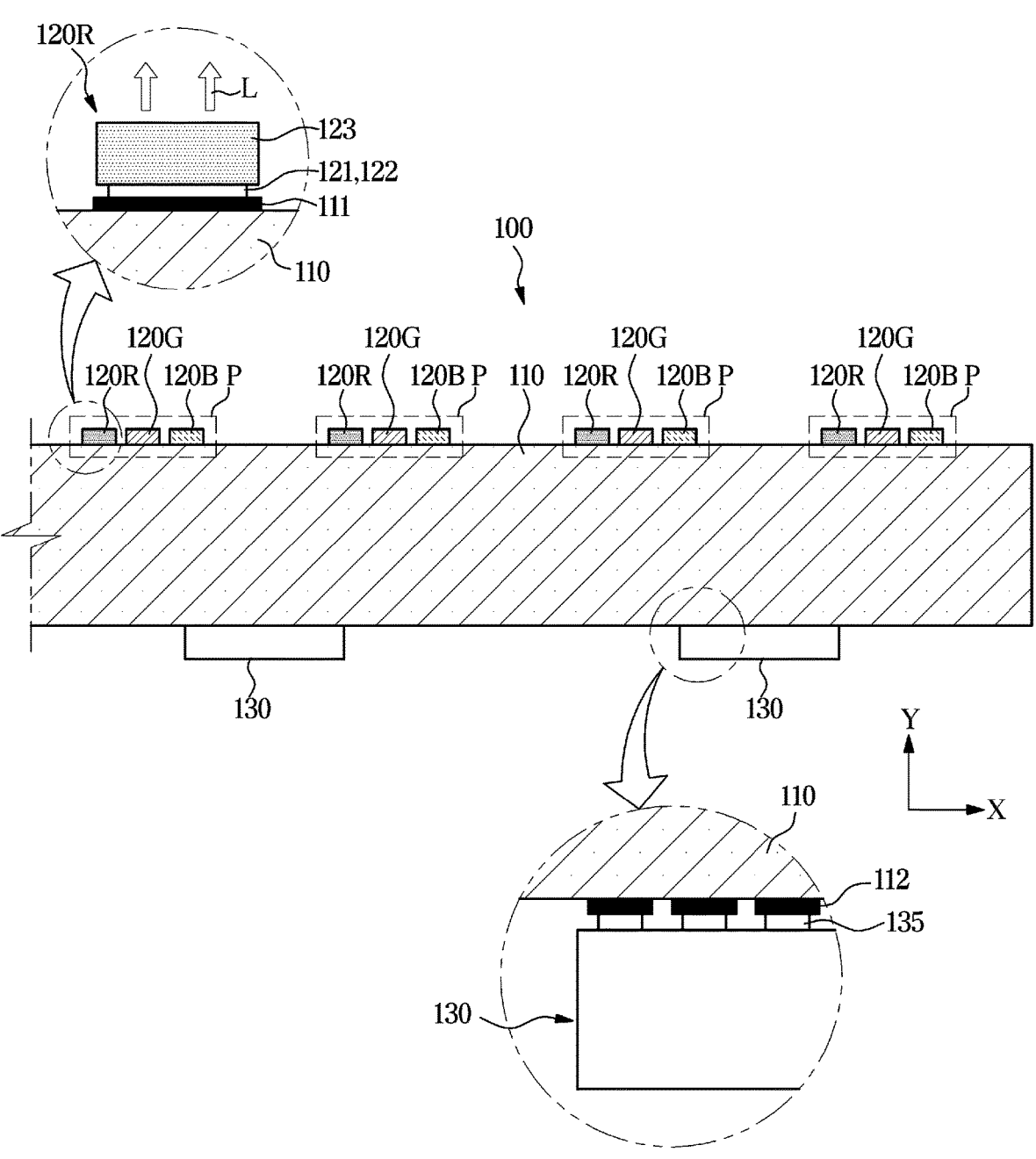

FIGS. 8 and 9 are side cross sections of a display module according to an embodiment.

Referring to FIG. 8, the plurality of inorganic light-emitting devices 120 may be disposed on an upper surface of a first substrate 110, and a plurality of micro pixel controllers 130 for controlling the plurality of inorganic light-emitting devices 120 may be disposed on a lower surface of the first substrate 110. In the current embodiment, a case in which a certain component is disposed on an upper or lower surface of another component may include both a case in which the certain component is disposed directly on the upper or lower surface of the other component and a case in which another layer or another component is disposed between the components.

The plurality of inorganic light-emitting devices 120 may be electrically connected with the upper surface of the first substrate 110, and the plurality of micro pixel controllers 130 may be electrically connected with the lower surface of the first substrate 110.

The first substrate 110 may be a glass substrate or a plastic substrate, although a kind of the first substrate 110 is not limited. In the following embodiment, for a detailed description, a case in which the first substrate 110 is implemented as a glass substrate will be described as an example.

In FIG. 9, a red inorganic light-emitting device 120R of a plurality of inorganic light-emitting devices 120R, 120G, and 120B configuring a pixel P is enlarged, and a part of a micro pixel controller 130 is enlarged. Although only the red inorganic light-emitting device 120 is enlarged for convenience, the remaining inorganic light-emitting devices 120G and 120B may also be electrically connected with the first substrate 110 in the same way.

Referring to FIG. 9, in the current embodiment, each inorganic light-emitting device 120 may have a flip chip structure in which a pair of electrodes 121 and 122 is disposed on an opposite surface of a light-emitting surface of a diode 123.

The pair of electrodes 121 and 122 may include an anode 121 and a cathode 122. For example, the anode 121 and the cathode 122 may be provided respectively at both ends in longitudinal direction (vertical direction) of the inorganic light-emitting device 120. FIG. 9 shows the inorganic light-emitting device 120 seen from the shorter side, and shows one electrode. The shown electrode may be the anode 121 or the cathode 122.

The inorganic light-emitting device 120 may be disposed such that the light-emitting surface is toward the upper direction (+Y direction), and the electrodes 121 and 122 provided on the opposite surface of the light-emitting surface may be electrically connected with an upper electrode pad 111 provided on the upper surface of the first substrate 110.

In the current embodiment, a case in which two components are electrically connected with each other may include cases in which conductive materials conducting electricity are directly soldered with each other, connected with each other through a separate wiring, or connected with each other through a conductive adhesive. There may be no limitation on connection methods as long as current flows between two connected components.

For example, soldering two components may use Au—In bonding, Au—Sn bonding, Cu pillar/SnAg bump bonding, Ni pillar/SnAg bump bonding, SnAgCu, SnBi, SnAg solder ball bonding, etc.

Also, in the case of using a conductive adhesive, a conductive adhesive, such as an Anisotropic Conductive Film (ACF), an Anisotropic Conductive Paste (ACP), etc., may be disposed between two components and pressure may be applied to cause current to flow in a direction in which the pressure is applied.

As described above, the pixel circuit 131 for switching or driving the inorganic light-emitting devices 120 may be provided on the separate second substrate 132, not the first substrate 110, to configure the micro pixel controller 130.

On the upper surface of the second substrate 132, a contact pin 135 for an electrical connection with the first substrate 110 may be provided, and the contact pin 135 may be electrically connected with a lower electrode pad 112 provided on the lower surface of the first substrate 110.

According to an embodiment of the display module 10, because circuit devices, such as thin film transistors, etc., for switching and driving the plurality of inorganic light-emitting devices 120 are provided on the separate micro pixel controller 130, instead of the first substrate 110, circuit devices such as thin film transistors, except for the electrode pads 111 and 112 or wirings, may need not to be formed on the first substrate 110. Accordingly, the first substrate 110 may be implemented as a glass substrate having excellent durability against heat emission of the inorganic light-emitting devices 120, and the first substrate 110 implemented as a glass substrate may have no influence on performance of the thin film transistors.

Also, the circuit devices may be prevented from being damaged in a process of cutting the first substrate 110 and forming wirings or a process of replacing the inorganic light-emitting devices 120, and the difficulty of a process of manufacturing the display module 10 may be lowered.

Also, because the micro pixel controller 130 is disposed on the lower surface of the first substrate 110, that is, on the opposite surface of the surface on which the inorganic light-emitting devices 120 are disposed, a reduction of a viewing angle by the micro pixel controller 130 covering side surfaces of the inorganic light-emitting devices 120 may be prevented.

Figure 10:
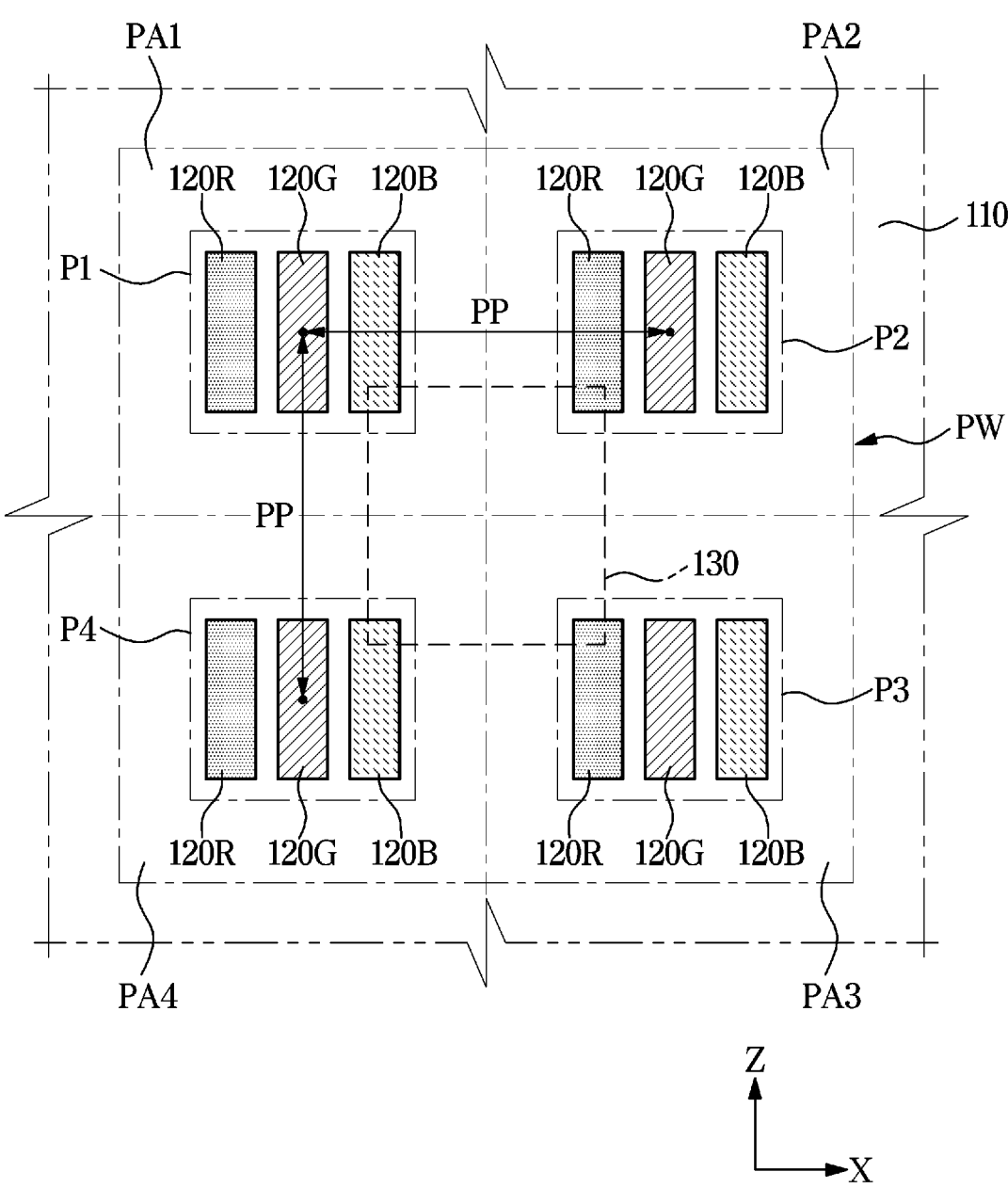
FIG. 10 shows an upper surface of a display module according to an embodiment.
Figure 11:
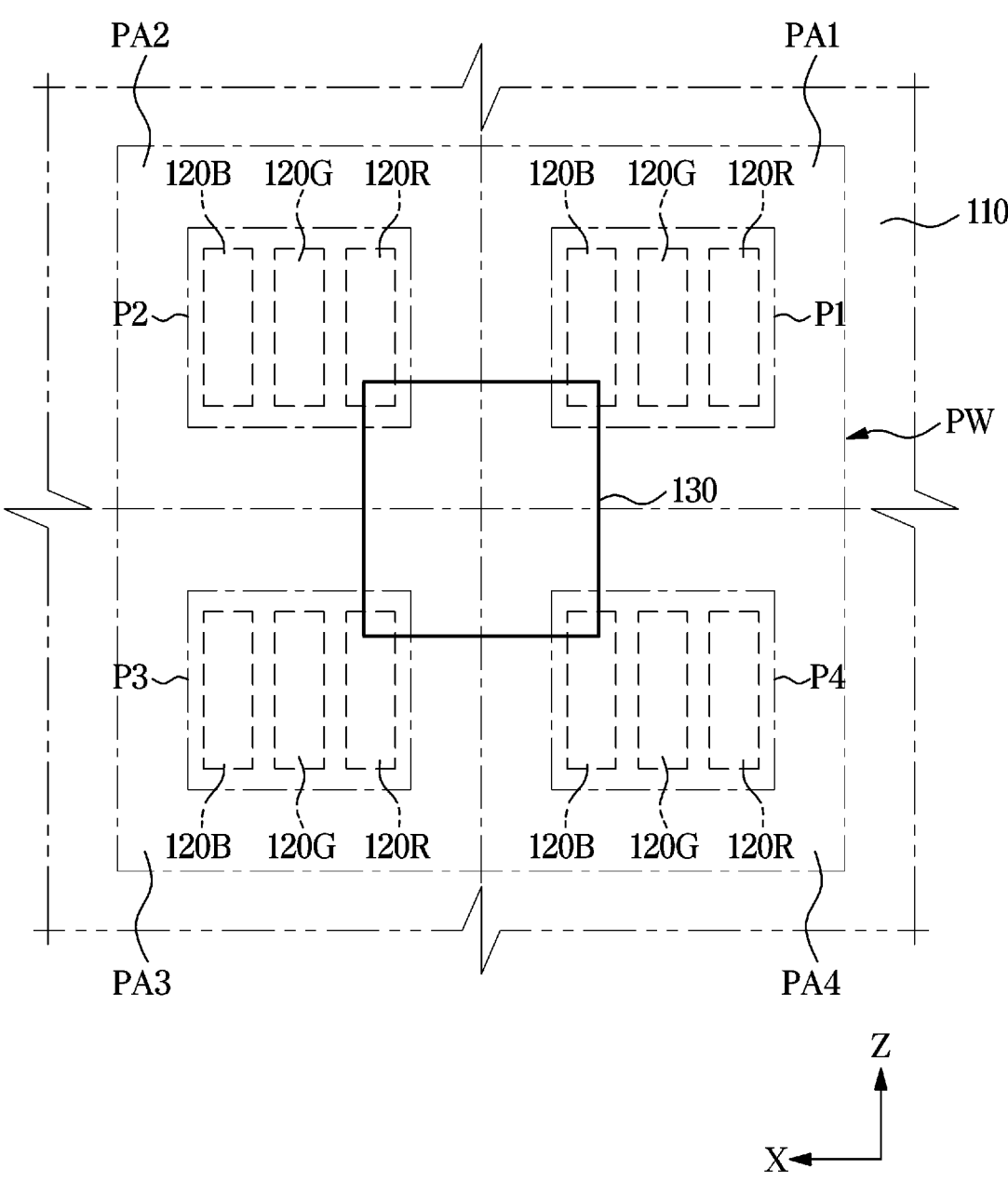
FIG. 11 shows a lower surface of a display module according to an embodiment.

FIG. 10 shows an upper surface of a display module according to an embodiment, and FIG. 11 shows a lower surface of a display module according to an embodiment.

For example, a micro pixel controller 130 may control pixels disposed in a 2xn arrangement or a nx2 arrangement, wherein n is an integer that is greater than or equal to 1. In an example of FIGS. 10 and 11, a case in which a micro pixel controller 130 controls four pixels $P_1$, $P_2$, $P_3$, and $P_4$ disposed in a 2×2 arrangement will be described as an example.

Referring to FIGS. 10 and 11, because the micro pixel controller 130 is disposed on the lower surface of the first substrate 110, a location or size of the micro pixel controller 130 may have no influence on an arrangement of the plurality of inorganic light-emitting devices 120R, 120O, and 120B on the upper surface of the first substrate 110. Also, the micro pixel controller 130 may be positioned with a desired size at a desired location regardless of the distance between the pixels P.

For example, although a size of the micro pixel controller 130 is larger than a size of a distance between the pixels P1, P2, P3, and P4, there may be no need to widen a distance (PP) between the adjacent pixels, and at least a part of the micro pixel controller 130 may overlap with at least a part of the pixels P1, P2, P3, and P4 in an up-down direction (Y-axis direction).

That is, in a case in which the micro pixel controller 130 is implemented as a rectangular parallelepiped such that the upper and lower surfaces have a rectangle shape, the micro pixel controller 130 may be positioned without influencing the distance between pixels (PP) although a length of a shorter side of the upper or lower surface is longer than a distance between border lines of the adjacent pixels P. The distance between the border lines of the adjacent pixels P may mean a distance between inorganic light-emitting devices 120 included in different pixels P among inorganic light-emitting devices 120 being adjacent to each other.

Accordingly, the distance between pixels (PP) may be minimized without any limitation by the micro pixel controller 130, and by minimizing the distance between pixels (PP), high resolution may be implemented within the same area. Also, necessary parts may be mounted on the micro pixel controller 130 without any size limitation by the distance between pixels (PP).

Also, the distance (PP) between adjacent pixels located to the upper, lower, left, and right of a pixel may be the same. In the current embodiment, a case in which certain values are the same may include both a case in which the corresponding values are exactly the same and a case in which the corresponding values are within a margin of error.

The distance between pixels (PP) may also be referred to as a pixel pitch, and in the current embodiment, a distance between pixels (PP) may represent a distance from a center of a pixel to a center of an adjacent pixel. An embodiment of the display module 10 is not limited to this, and another definition may be applied to the distance between pixels (PP).

According to the example of FIGS. 10 and 11, the micro pixel controller 130 may be disposed on the lower surface of the first substrate 110 at a location corresponding to the four pixels P1, P2, P3, and P4 which the micro pixel controller 130 controls. For example, the micro pixel controller 130 may be disposed at a location corresponding to pixel areas PA1, PA2, PA3, and PA4 of the four pixels P1, P2, P3, and P4 which the micro pixel controller 130 controls. In the current embodiment, a pixel area may be an area where each pixel is located, and an area in which each pixel is included upon partitioning of an active area of the display panel 100 into the same arrangement (M×N) as that of pixels may be defined as a pixel area of the corresponding pixel.

As a more detailed example, the micro pixel controller 130 may be disposed below an area (that is, an entire pixel area PW)that is a total of the pixel areas PA1, PA2, PA3, and PA4 of the four pixels P1, P2, P3, and P4 which the micro pixel controller 130 controls.

Also, the micro pixel controller 130 may be disposed at a location corresponding to a center of the entire pixel area PW.

By positioning the micro pixel controller 130 in this way, a length of a wiring may be minimized upon an electrical connection of the light-emitting devices 120 with the micro pixel controller 130 for controlling the light-emitting devices 120 through a via hole wiring.

However, the position of the micro pixel controller 130 shown in FIGS. 10 and 11 may be only an example that is applicable to the display module 10, and there may be various modified examples in regard of a number of pixels that are controlled by a micro pixel controller 130 and a location at which the micro pixel controller 130 is disposed on the lower surface of the first substrate 110.

Figure 12:
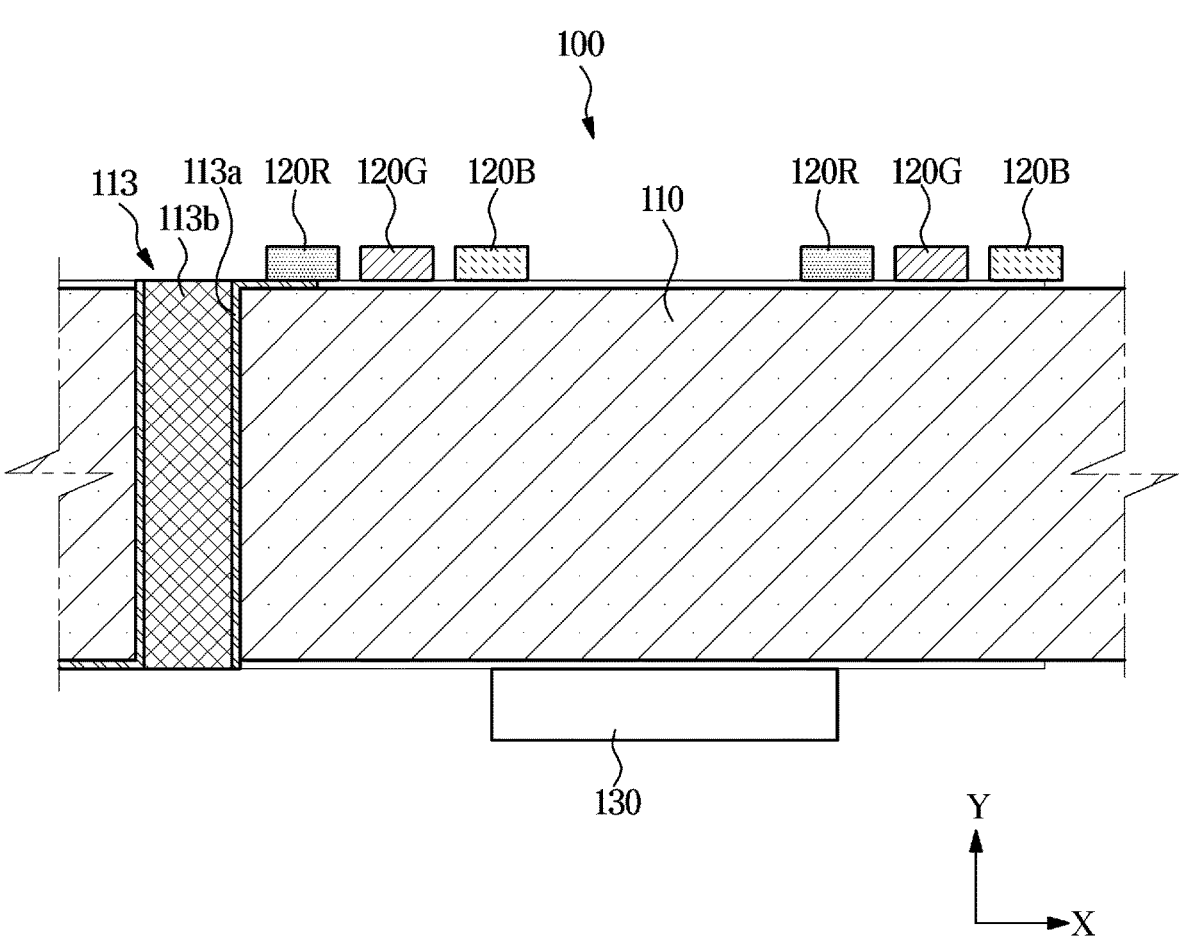
FIG. 12 shows a side cross section of a display module according to an embodiment in a case in which inorganic light-emitting devices are connected with a micro pixel controller through a via hole.
Figure 13:
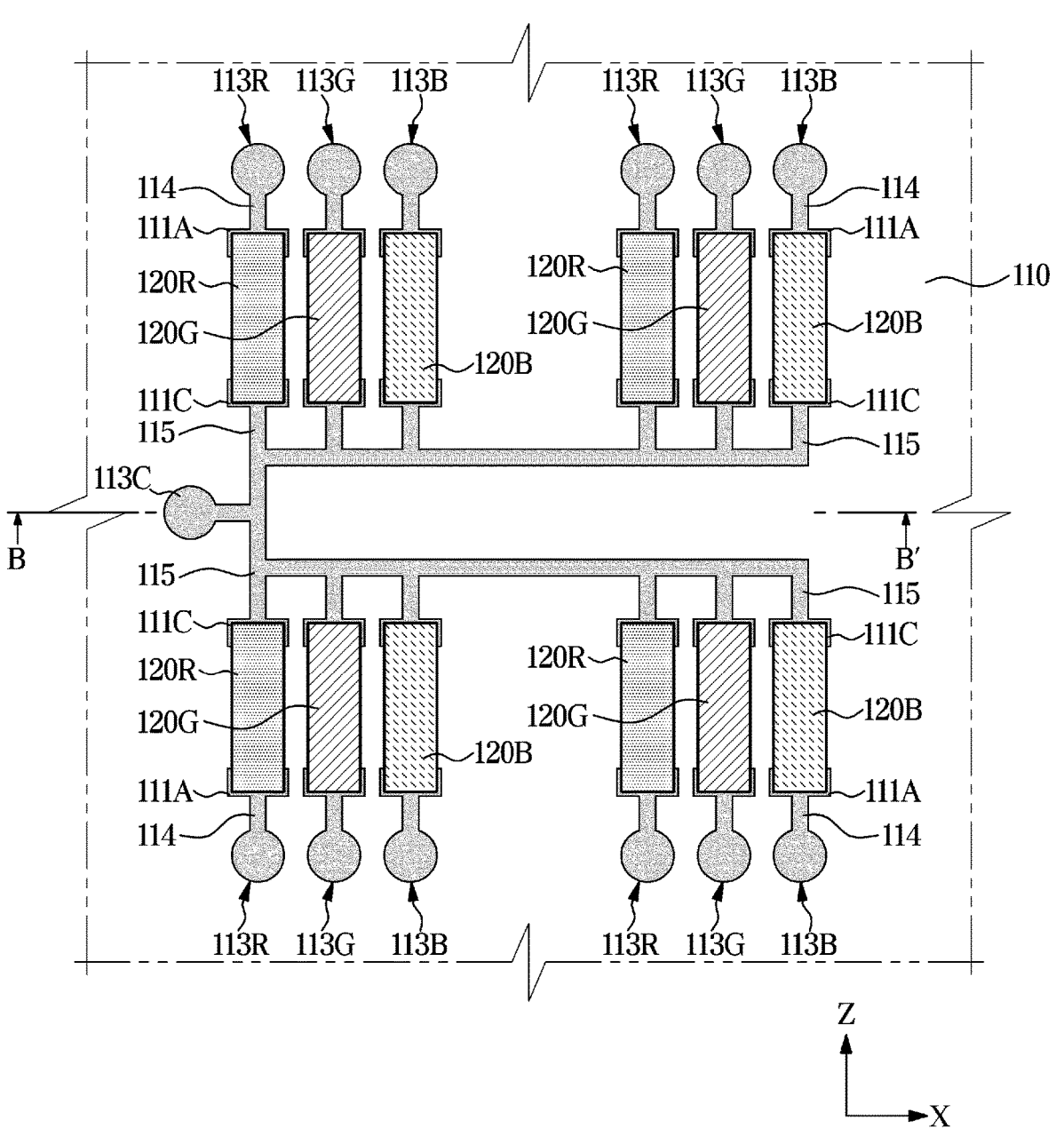
FIG. 13 shows an upper surface of a display module according to an embodiment in a case in which inorganic light-emitting devices are connected with a micro pixel controller through a via hole.
Figure 14:
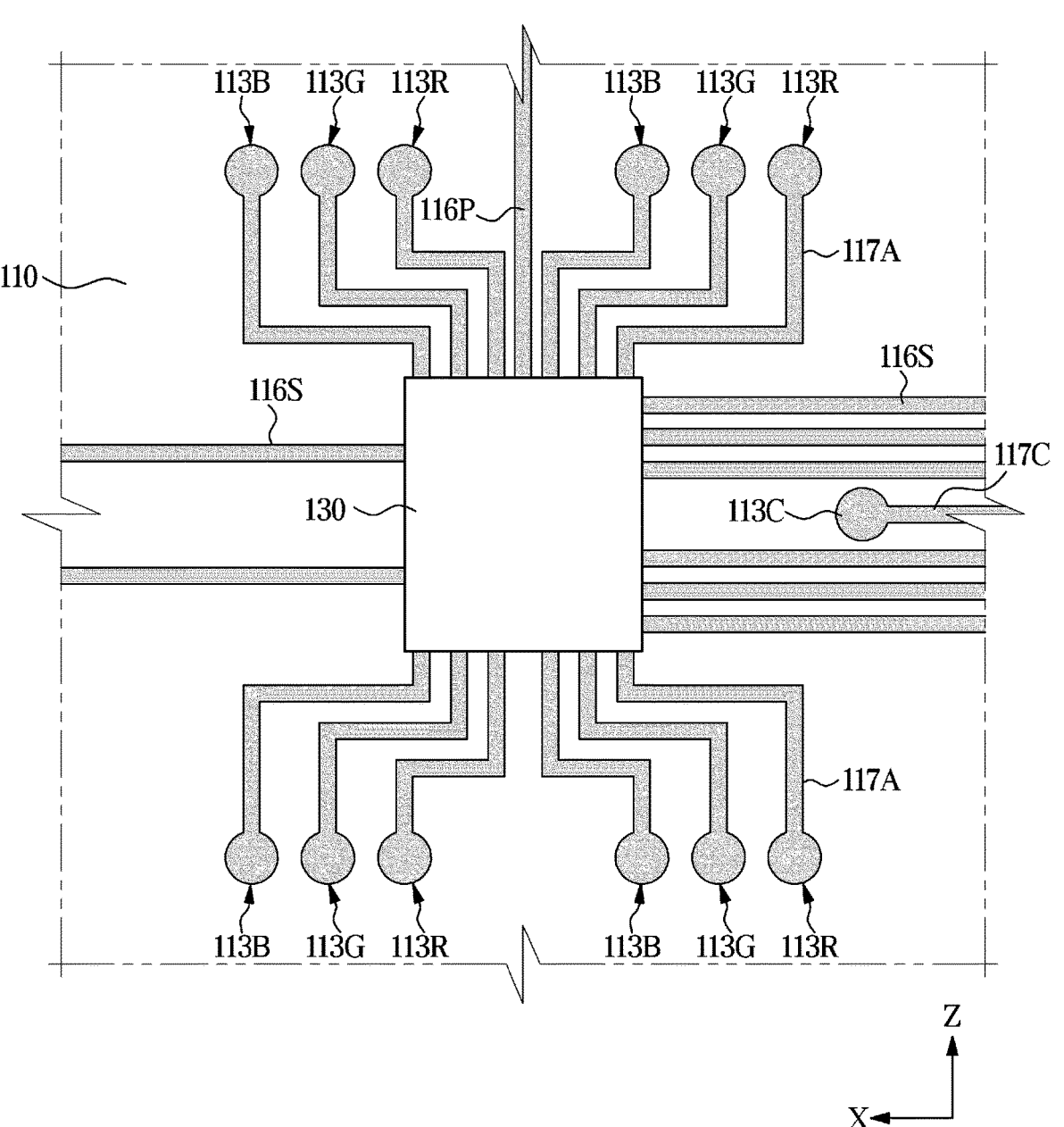
FIG. 14 shows a lower surface of a display module according to an embodiment in a case in which inorganic light-emitting devices are connected with a micro pixel controller through a via hole.

FIG. 12 shows a side cross section of a display module according to an embodiment in a case in which inorganic light-emitting devices are connected with a micro pixel controller through a via hole, FIG. 13 shows an upper surface of a display module according to an embodiment in a case in which inorganic light-emitting devices are connected with a micro pixel controller through a via hole, and FIG. 14 shows a lower surface of a display module according to an embodiment in a case in which inorganic light-emitting devices are connected with a micro pixel controller through a via hole. The side cross section shown in FIG. 12 is a vertical section taken along B-B' shown in FIG. 13.

Referring to FIG. 12, a connection method through a Vertical interconnection Access (VIA) hole may be adopted as an example for electrically connecting the plurality of inorganic light-emitting devices 120 disposed on the upper surface of the first substrate 110 with the micro pixel controller 130 disposed on the lower surface of the first substrate 110.

In a case in which the first substrate 110 is a glass substrate, by forming a via hole in the first substrate 110 by applying a Through-Glass Via (TGV) technique, plating an inner wall of the formed via hole with a conductive material 113a such as copper, and then performing via filling of filling the via hole with a filling material 113b, at least one via hole 113 for electrically connecting the plurality of inorganic light-emitting devices 120R, 120G, and 120B formed on the upper surface of the first substrate 110 with the micro pixel controller 130 disposed on the lower surface of the first substrate 110 may be formed.

The filling material 113*b* filled in the via hole may be a conductive material or a non-conductive material. In the following embodiment, the via 113 formed by penetrating the first substrate 110 is referred to as a via hole wiring 113.

FIG. 13 shows an example of an upper surface wiring structure of the first substrate 110. Referring to the example of FIG. 13, a via hole wiring 113R for electrically connecting the anode 121 of the red inorganic light-emitting device 120R disposed on the upper surface of the first substrate 110 with the micro pixel controller 130 disposed on the lower surface of the first substrate 110, a via hole wiring 113G for electrically connecting the anode 121 of the green inorganic light-emitting device 120G disposed on the upper surface of the first substrate 110 with the micro pixel controller 130 disposed on the lower surface of the first substrate 110, and a via hole wiring 113B for electrically connecting the anode 121 of the blue inorganic light-emitting device 120B disposed on the upper surface of the first substrate 110 with the micro pixel controller 130 disposed on the lower surface of the first substrate 110 may be formed in the first substrate 110.

An anode pad 111A connected with the anode 121 of each inorganic light-emitting device 120 in the upper electrode pad 111 formed on the upper surface of the first substrate 110 may be connected with the via hole wirings 113R, 113G, and 113B by an anode wiring 114 among upper wirings of the first substrate 110.

A common reference voltage $V_{SS}$ may be applied to cathodes 122 of the plurality of inorganic light-emitting devices 120R, 120G, and 120B. A via hole wiring 113C for applying the common reference voltage $V_{SS}$ to the cathodes 122 may be formed in the first substrate 110, and a cathode pad 111C connected with the cathode 122 of each inorganic light-emitting device 120 may be connected with the via hole wiring 113C by a cathode wiring 115 among the upper wirings of the first substrate 110.

FIG. 14 shows an example of a lower surface wiring structure of the first substrate 110. Referring to FIG. 14, the via hole wiring 113 penetrating the first substrate 110 may be electrically connected with the micro pixel controller 130 or a FPCB for supplying power through lower wirings formed on the lower surface of the first substrate 110.

More specifically, the via hole wirings 113R, 113G, and 113B connected with the anodes 121 of the inorganic light-emitting devices 120R, 120B, and 1208 may be electrically connected with the micro pixel controller 130 through a lower wiring 117.

Driving current $C_D$ generated in the micro pixel controller 130 may be applied to the anodes 121 of the inorganic light-emitting devices 120R, 120G, and 120B through the lower wiring 117, the via hole wirings 113R, 113G, and 113B, and the anode wiring 114.

The via hole wiring 113C connected with the cathodes 122 of the inorganic light-emitting devices 120R, 120G, and 120B may be electrically connected with the FPCB for supplying power through the lower wiring to apply the reference voltage $V_{SS}$ to the cathodes 122 of the inorganic light-emitting devices 120R, 120G, and 1208.

Also, a lower wiring 116 for applying a gate signal and a data signal or a supply voltage $V_{DD}$ to the micro pixel controller 130 may be formed on the lower surface of the first substrate 110.

The above-described wiring structure shown in FIGS. 12 to 14 may be only an example that is applied to the display module 10. Accordingly, various wiring structures, instead of the above-described wiring structure, may be applied to an embodiment of the display module 10.

Meanwhile, as another example for electrically connecting the plurality of inorganic light-emitting devices 120R, 120G, and 120B disposed on the upper surface of the first substrate 110 with the micro pixel controller 130 disposed on the lower surface of the first substrate 110, a connection method through a side wiring may be adopted.

Figure 15:
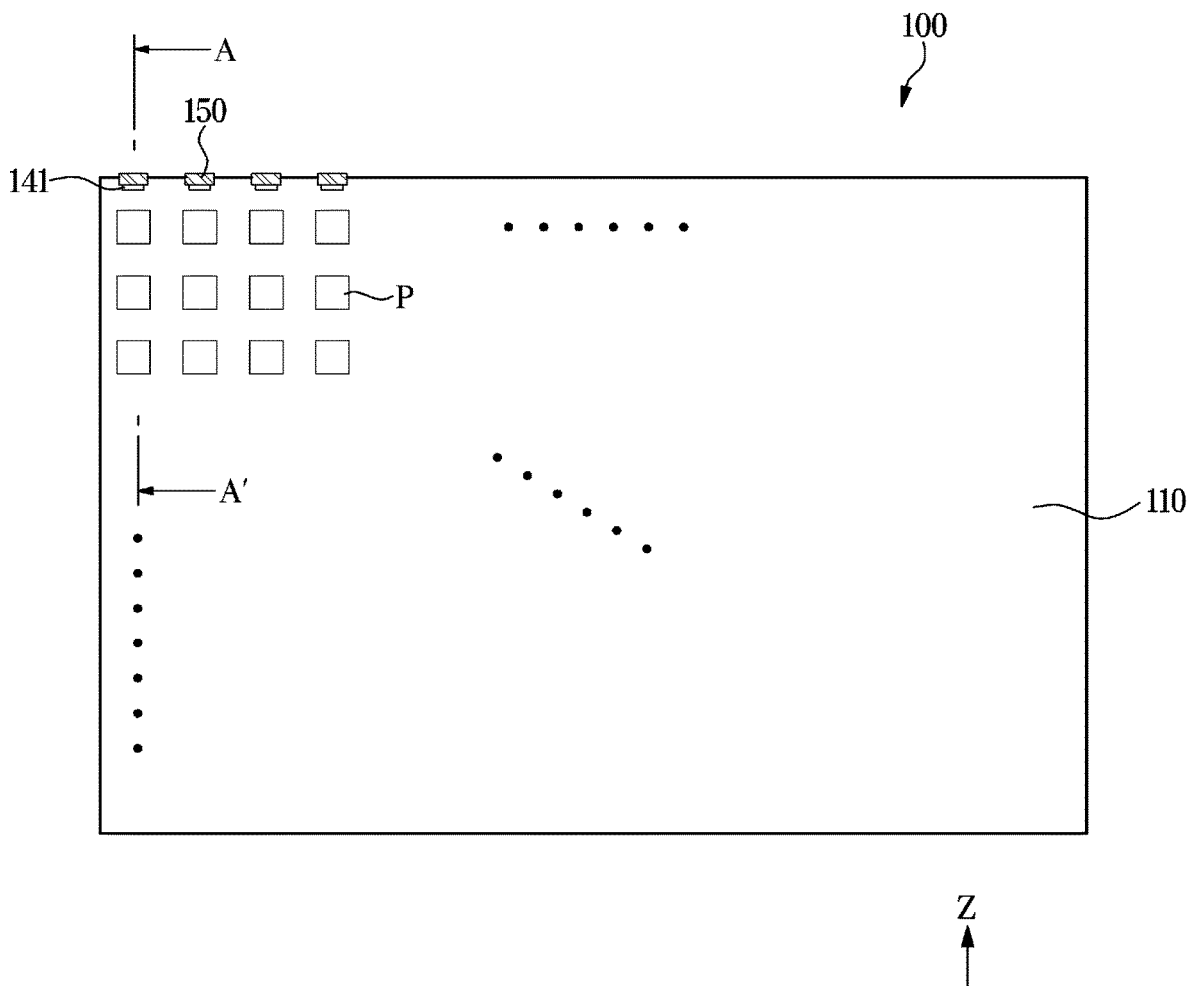
FIG. 15 shows an upper surface of a display module according to an embodiment in a case in which inorganic light-emitting devices are connected with a micro pixel controller through a side wiring.
Figure 16:
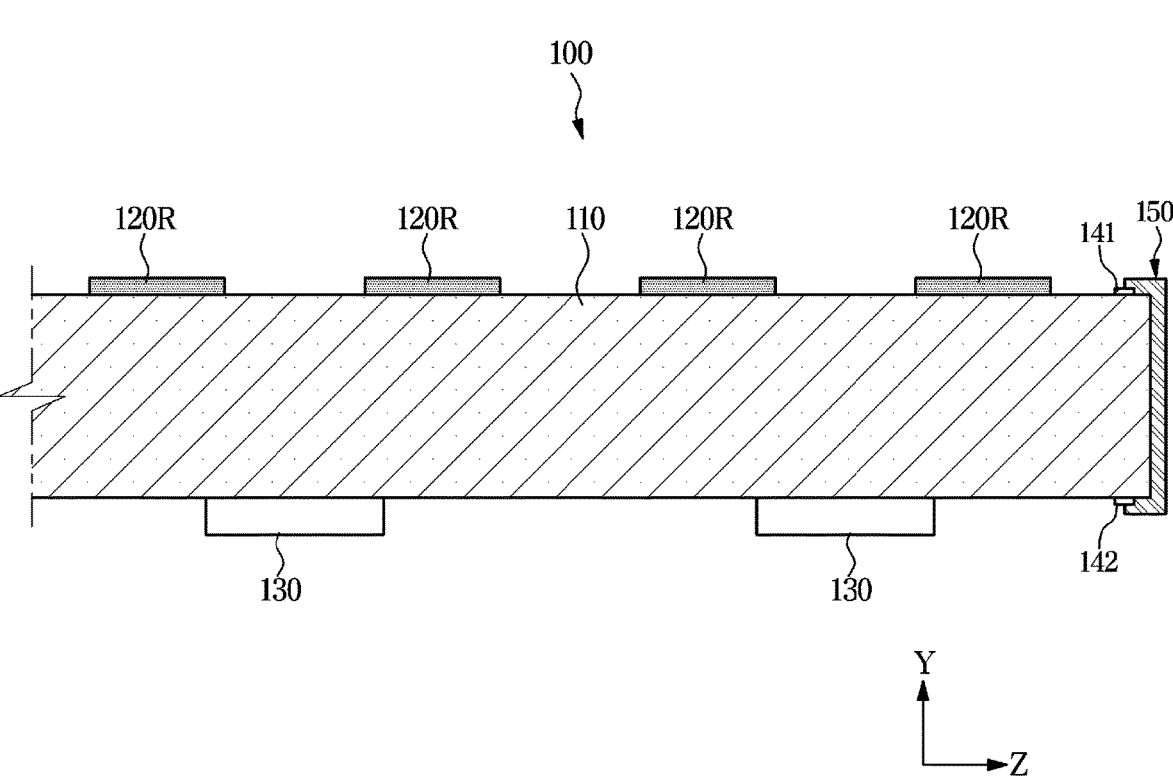
FIG. 16 shows a side cross section of a display module according to an embodiment in a case in which inorganic light-emitting devices are connected with a micro pixel controller through a side wiring.
Figure 17:
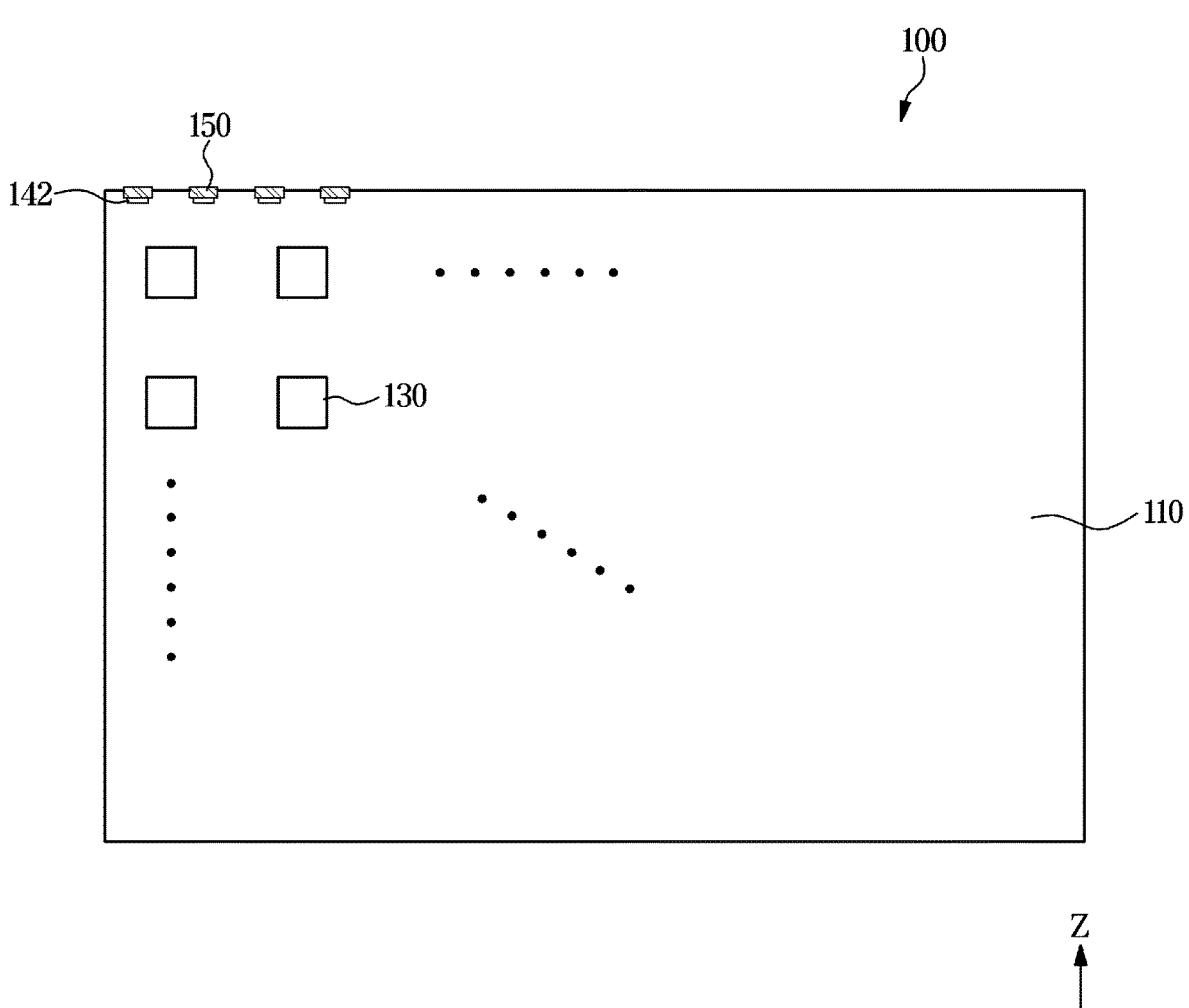
FIG. 17 shows a lower surface of a display module according to an embodiment in a case in which inorganic light-emitting devices are connected with a micro pixel controller through a side wiring.

FIG. 15 shows an upper surface of a display module according to an embodiment in a case in which inorganic light-emitting devices are connected with a micro pixel controller through a side wiring, FIG. 16 shows a side cross section of a display module according to an embodiment in a case in which inorganic light-emitting devices are connected with a micro pixel controller through a side wiring, and FIG. 17 shows a lower surface of a display module according to an embodiment in a case in which inorganic light-emitting devices are connected with a micro pixel controller through a side wiring. The side cross section shown in FIG. 16 is a vertical section taken along A-A' shown in FIG. 15.

Referring to FIGS. 15 to 17, a side wiring 150 may be formed on one side surface of the first substrate 110 to connect the upper wirings of the first substrate 110 with the lower wirings. Although not shown in the drawings, an upper wiring extending from each pixel P may be electrically connected with the side wiring 150 through an upper connection pad 141 provided at an edge area of the upper surface of the first substrate 110, and a lower wiring extending from the micro pixel controller 130 may be electrically connected with the side wiring 150 through a lower connection pad 142 provided at an edge area of the lower surface of the first substrate 110.

That is, the plurality of inorganic light-emitting devices 120 disposed on the upper surface of the first substrate 110 may be electrically connected with the micro pixel controller 130 disposed on the lower surface of the first substrate 110, through the upper wirings, the upper connection pad 141, the side wiring 150, the lower connection pad 142, and the lower wirings.

More specifically, the anode 121 of each inorganic light-emitting device 120 may receive driving current Ci from the micro pixel controller 130 through the side wiring 150, and the cathode 122 of the inorganic light-emitting device 120 may receive a reference voltage $V_{SS}$ from the FPCB for supplying power through the side wiring 150.

The side wiring 150 may be provided on at least one side surface among four side surfaces of the first substrate 110, and a number of side wirings 150 may be reduced by using a multiplexer MUX.

The side wiring 150 may be formed by applying a conductive material on the side surface of the first substrate 110, and a method for applying a conductive material may adopt one of various methods including an inkjet method, a stamping method, a screen printing method, a metal deposition method, an adhesion method using a tape, an etching method, etc.

Figure 18:
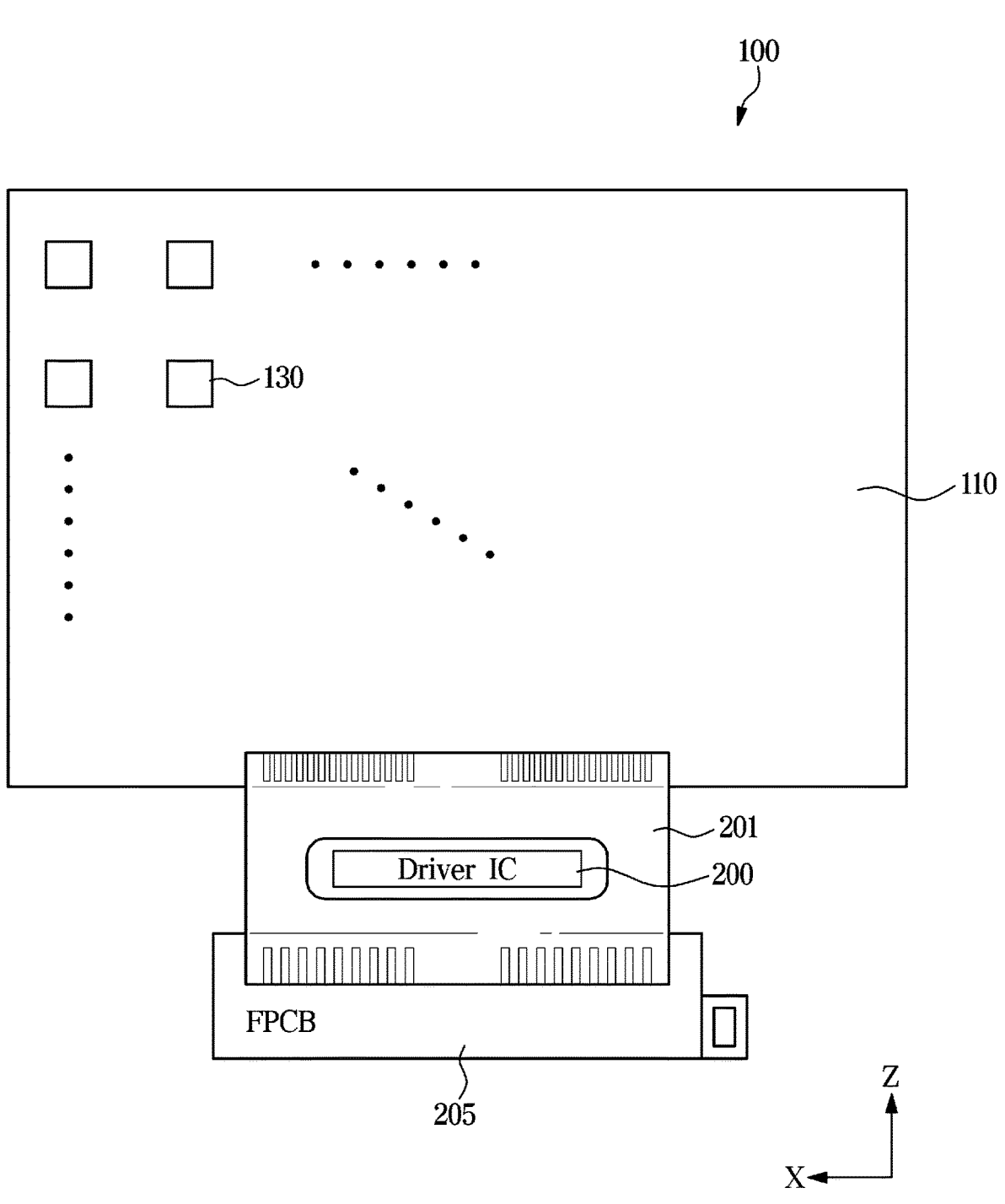
FIG. 18 shows an example of a method for electrically connecting a display panel with a driver IC in a display module according to an embodiment.

FIG. 18 shows an example of a method for electrically connecting a display panel with a driver IC in a display module according to an embodiment.

The driver KC 200 may be electrically connected with the display panel 100 by adopting one of various bonding methods including Chip on Film (COF) or Film on Glass (FOG) bonding, Chip on Glass (COG) bonding, Tape Automated Bonding (TAB), etc.

For example, in a case in which the COF bonding is adopted, as shown in FIG. 18, the driver IC 200 may be mounted on the film 201, one end of the film 201 on which the driver IC 200 is mounted may be electrically connected with the first substrate 110, and the other end may be electrically connected with the FPCB 205.

The one end of the film 201 on which the driver IC 200 is mounted may be electrically connected with one of lower electrode pads 112 provided on the lower surface of the first substrate 110, and the lower electrode pad 112 electrically connected with the film 201 on which the driver IC 200 is mounted may be connected with the lower wiring extending from the micro pixel controller 130. The micro pixel controller 130 may receive a gate signal and a data signal from the driver IC 200 through the corresponding lower wiring.

Figure 19:
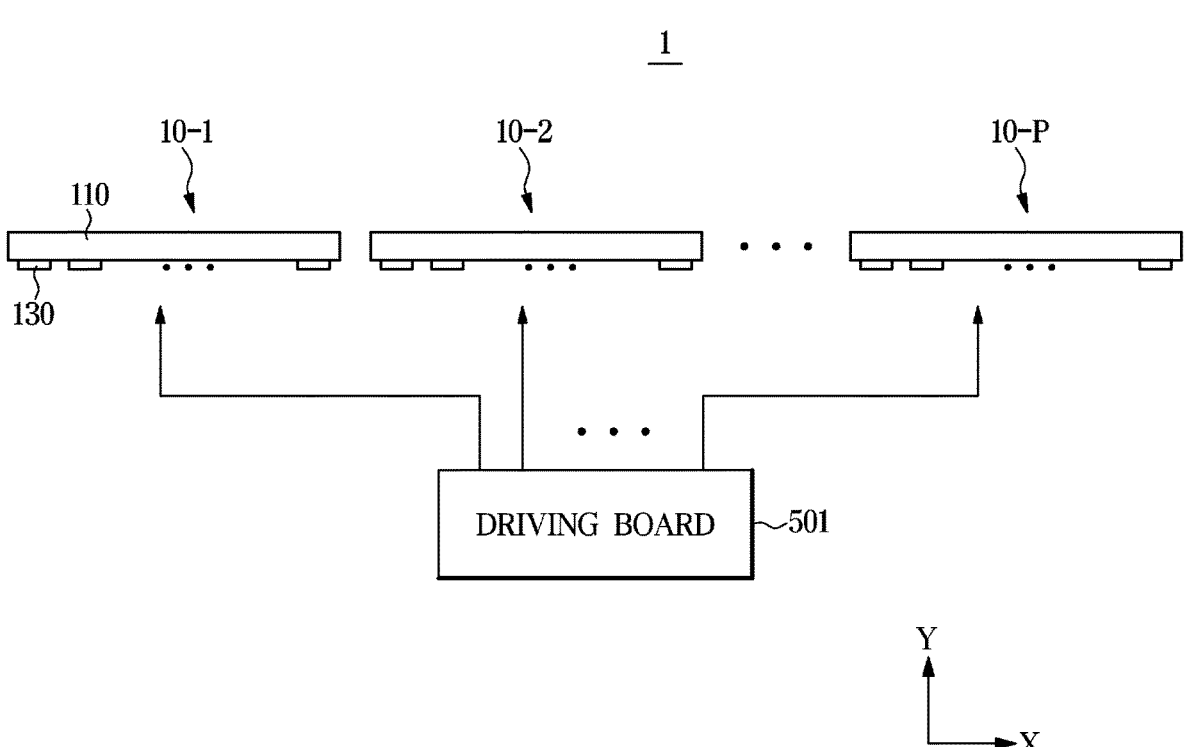
FIGS. 19 and 20 show examples of signals that are transferred to a plurality of tiled display modules in a display device according to an embodiment.
Figure 20:
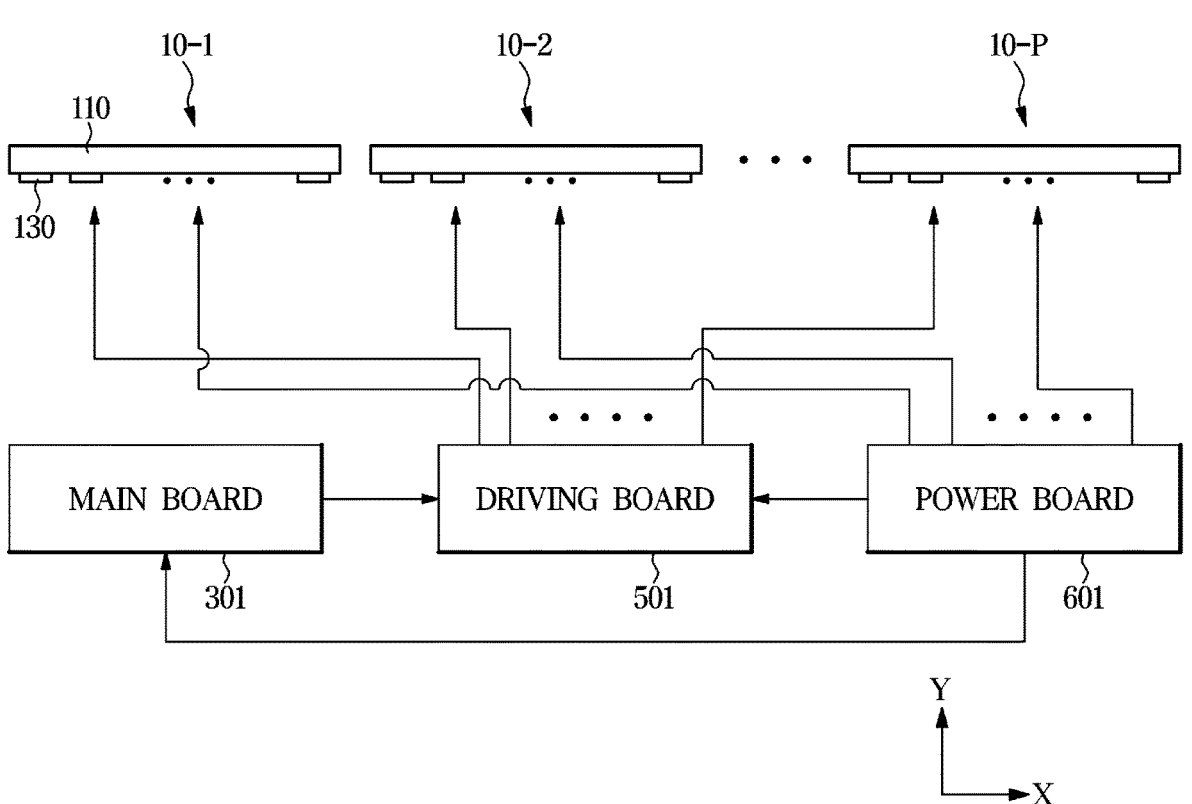

FIGS. 19 and 20 show examples of signals that are transferred to a plurality of tiled display modules in a display device according to an embodiment.

Referring to FIG. 19, the plurality of display modules 10-1, 10-2, . . . 10-n may be tiled to implement the display device 1 having a large-scaled screen. FIGS. 19 and 20 show the display device 1 on an XY plane, wherein one-dimensional arrangement of display modules 10-1, 10-2, . . . 10-P is shown. However, the plurality of display modules 10-1, 10-2, . . . 10-n may be arranged two-dimensionally as described above with reference to FIG. 1.

Referring again to FIG. 18 described above, the display panel 100 may be connected with the FPCB 205 through the film 201 on which the driver IC 200 is mounted. The FPCB 205 may be connected with a driving board 501 to electrically connect the display module 10 with the driving board 501.

On the driving board 501, a timing controller 500 may be provided. Accordingly, the driving board 501 may be referred to as a T-con board. The plurality of display modules 10-1, 10-2, . . . 10-n may receive image data, a timing control signal, etc. from the driving board 501.

Referring to FIG. 20, the display device 1 may further include a main board 301 and a power board 601. The above-described main controller 300 may be provided on the main board 301, and a power circuit required to supply power to the plurality of display modules 10-1, 10-2, . . . , 10-n may be provided on the power board 601.

The power board 601 may be electrically connected with the plurality of display modules 10-1, 10-2, . . . , 10-n through the FPCB, and supply a supply voltage $V_{DD}$, a reference voltage $V_{SS}$, etc. to the plurality of display modules 10-1, 10-2, . . . , 10-n connected through the FPCB.

For example, the supply voltage Vim supplied from the power board 601 may be applied to the micro controller 130 disposed on the lower surface of the first substrate 110 through the lower wiring, and the reference voltage $V_{SS}$ may be applied to the inorganic light-emitting devices 120 disposed on the upper surface of the first substrate 110 through the via hole wiring 113 or the side wiring 150.

In the above-described example, the plurality of display modules 10-1, 10-2, . . . 10-P share the driving board 501, however, each display module 10 may be connected with a separate driving board 501. Alternatively, the plurality of display modules 10-1, 10-2, . . . 10-P may be grouped, and each group may be connected with a separate driving board 501.

Figure 21:
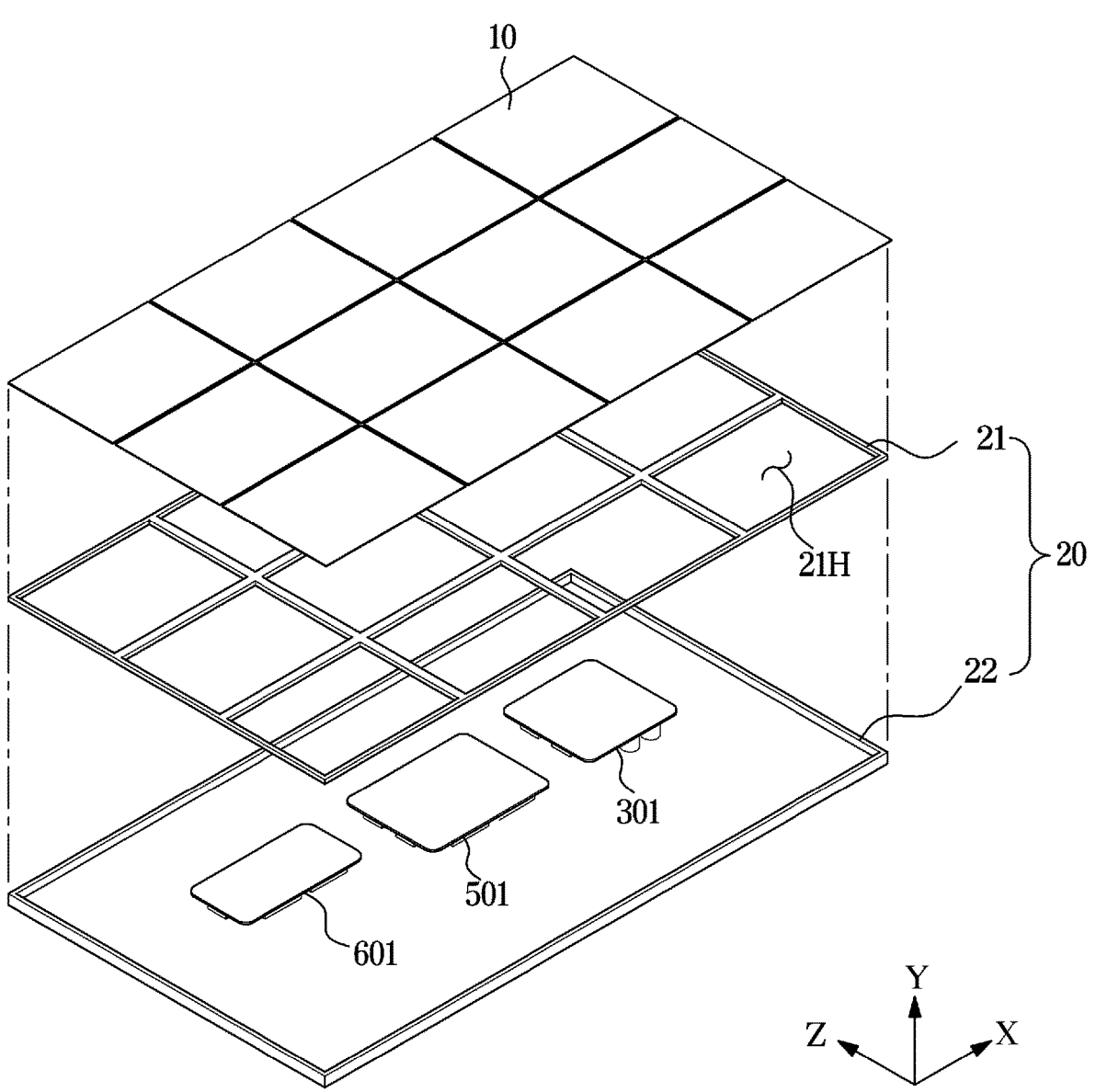
FIG. 21 shows an example of a method for coupling a plurality of display modules with a housing in a display device according to an embodiment.

FIG. 21 shows an example of a method for coupling a plurality of display modules with a housing in a display device according to an embodiment.

As described above, the plurality of display modules 10 may be arranged in a form of a two-dimensional matrix and fixed to the housing 20. Referring to the example of FIG. 21, the plurality of display modules 10 may be installed on the frame 21 located there below, and the frame 21 may have a two-dimensional mesh structure of which some areas corresponding to the plurality of display modules 10 open.

More specifically, openings 21H may be formed in the frame 21 by a number of the display modules 10, and the openings 21H may have the same arrangement as the plurality of display modules 10.

Also, a size of each opening 21H may depend on a location, size, and number of the micro pixel controller 130 disposed on the lower surface of the first substrate 110. For example, the openings 21H may have sizes capable of exposing all of the plurality of micro pixel controllers 130 disposed below the first substrate 110.

Each of the plurality of display modules 10 may be installed on the frame 21 at edge areas of the lower surface. The edge areas installed on the frame 21 may be areas on which the micro pixel controller 130 is not positioned.

Meanwhile, the plurality of display modules 10 may be installed on the frame 21 by using a magnetic force by a magnet, being coupled by a mechanical structure, or being adhered by an adhesive. A method in which the display module 10 is installed on the frame 21 is not limited.

According to installing of the plurality of display modules 10 on the frame 21 having the mesh structure shown in FIG. 21, the plurality of micro pixel controllers 130 disposed on the lower surface of the first substrate 110 may be exposed through the openings 21H, and the micro pixel controllers 130 may be prevented from being damaged due to a collision or contact with the frame 21.

The driving board 501, the main board 301, and the power board 601 may be disposed below the frame 21, and may be electrically connected with the plurality of display modules 10 through the openings 21H formed in the frame 21.

A lower cover 22 may be coupled with the lower portion of the frame 21, and the lower cover 22 may form a lower surface appearance of the display device 1.

In the above-described example, a case in which the display modules 10 are arranged two-dimensionally has been described as an example. However, the display module 10 may be arranged one-dimensionally, and in this case, the structure of the frame 21 may also be modified to a one-dimensional mesh structure.

Figure 22:
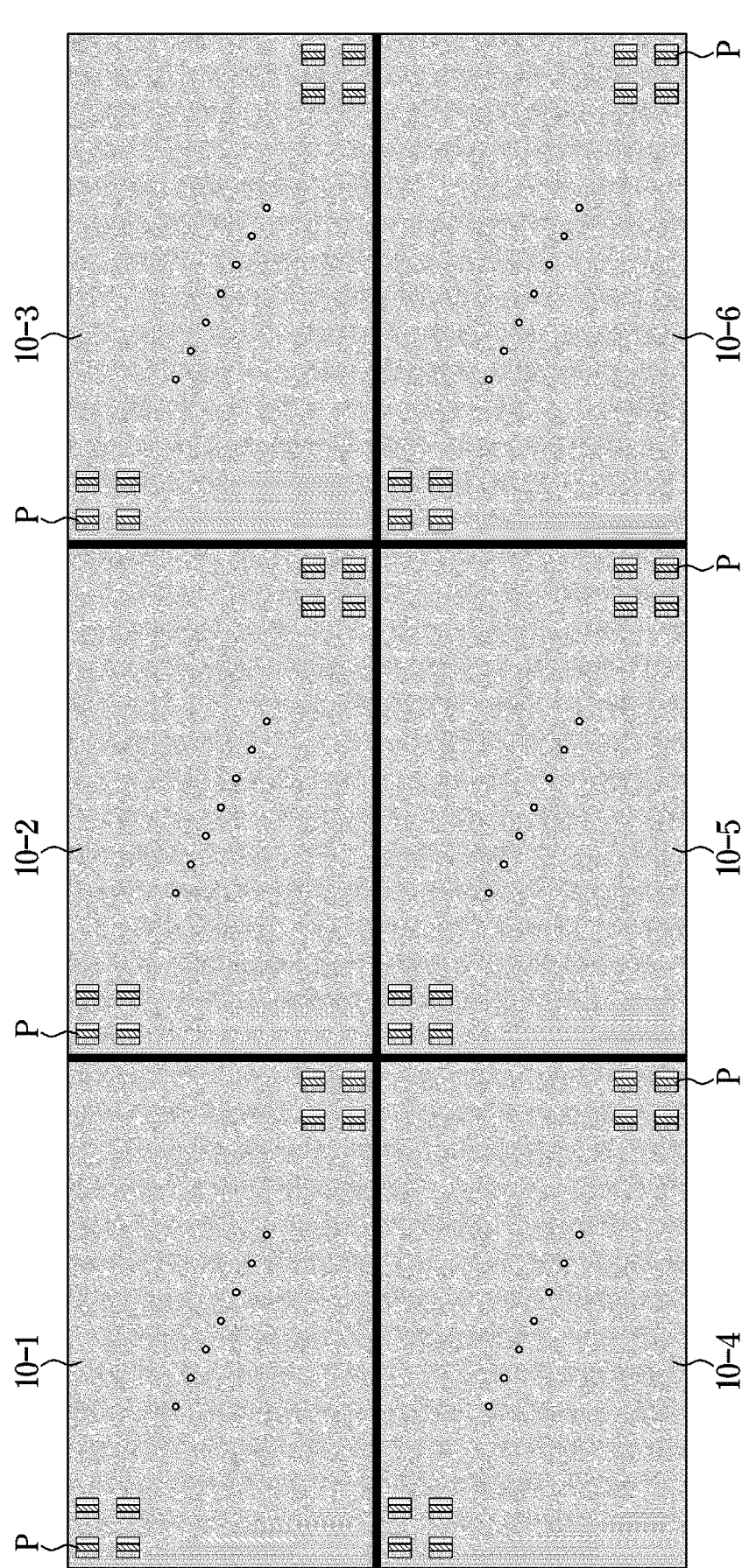
FIG. 22 shows an example of BM processing that is performed on a plurality of display modules in a display device according to an embodiment.

FIG. 22 shows an example of BM processing that is performed on a plurality of display modules in a display device according to an embodiment.

Referring to FIG. 22, black matrix (BM) processing for blocking unnecessary light except for light required for implementing an image, preventing light from being diffusely reflected in gaps between pixels, and improving contrast may be performed on display modules 10-1 to 10-6.

For example, by using one of various BM processing methods, such as printing a black ink on the upper surface of the first substrate 110, performing patterning with a black photosensitive material, or using black ACF upon mounting of the inorganic light-emitting devices 120 on the first substrate 110, a black matrix layer may be formed on the upper surface of the first substrate 110.

Also, by performing BM processing in spaces between the plurality of display modules 10, light may be prevented from being diffusely reflected in gaps between the modules.

Hereinafter, a method for manufacturing a display module according to an embodiment will be described. According to the method for manufacturing the display module according to an embodiment, the above-described display module 10 may be manufactured. Accordingly, content described above with reference to FIGS. 1 to 22 may be applied in the same way to the method for manufacturing the display module according to an embodiment, unless stated.

Figure 23:
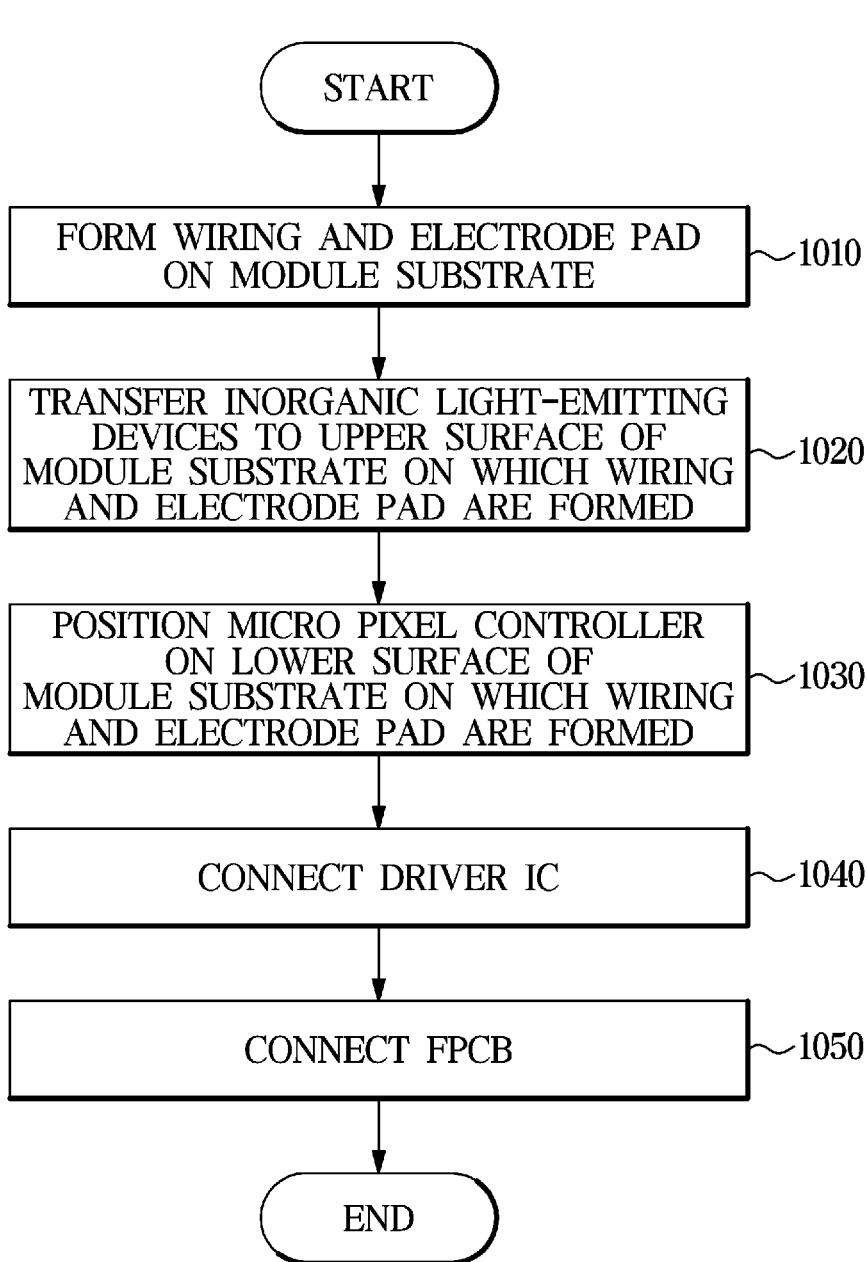
FIG. 23 is a flowchart showing a method for manufacturing a display module according to an embodiment.

FIG. 23 is a flowchart showing a method for manufacturing a display module according to an embodiment, and FIGS. 24 to 30 show a display module that is manufactured by some operations shown in FIG. 23.

Referring to FIG. 23, a wiring and an electrode pad may be formed on a module substrate (1010).

The module substrate may be the first substrate 110 described above, and the wiring and the electrode pad may be formed on both the upper and lower surfaces of the first substrate 110. For example, by forming a metal material layer such as copper on the upper surface of the first substrate 110 and performing a photolithography process including processes of application of a photosensitive material, exposure, developing, etc. and an etching process of selectively removing unnecessary parts, a wiring and an electrode pad may be formed on the first substrate 110.

Figure 24:
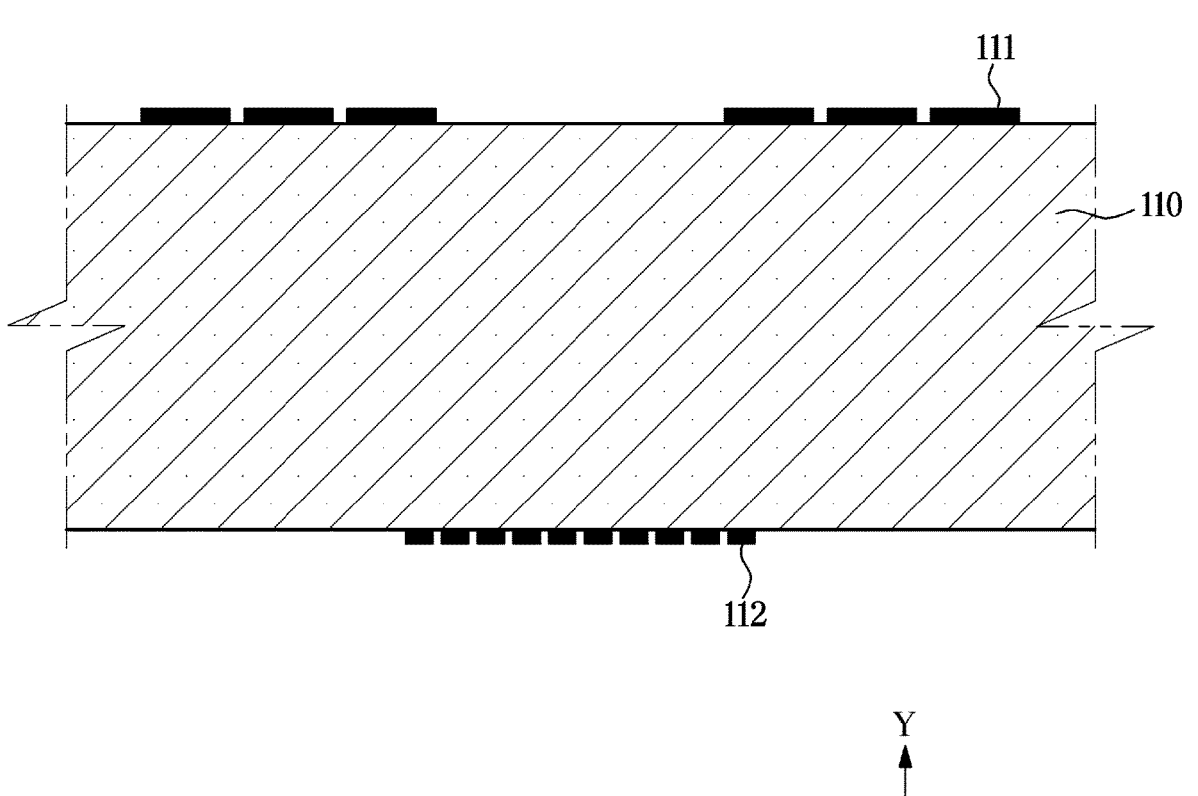
FIGS. 24 to 30 show a display module that is manufactured by some operations shown in FIG. 23.
Figure 25:
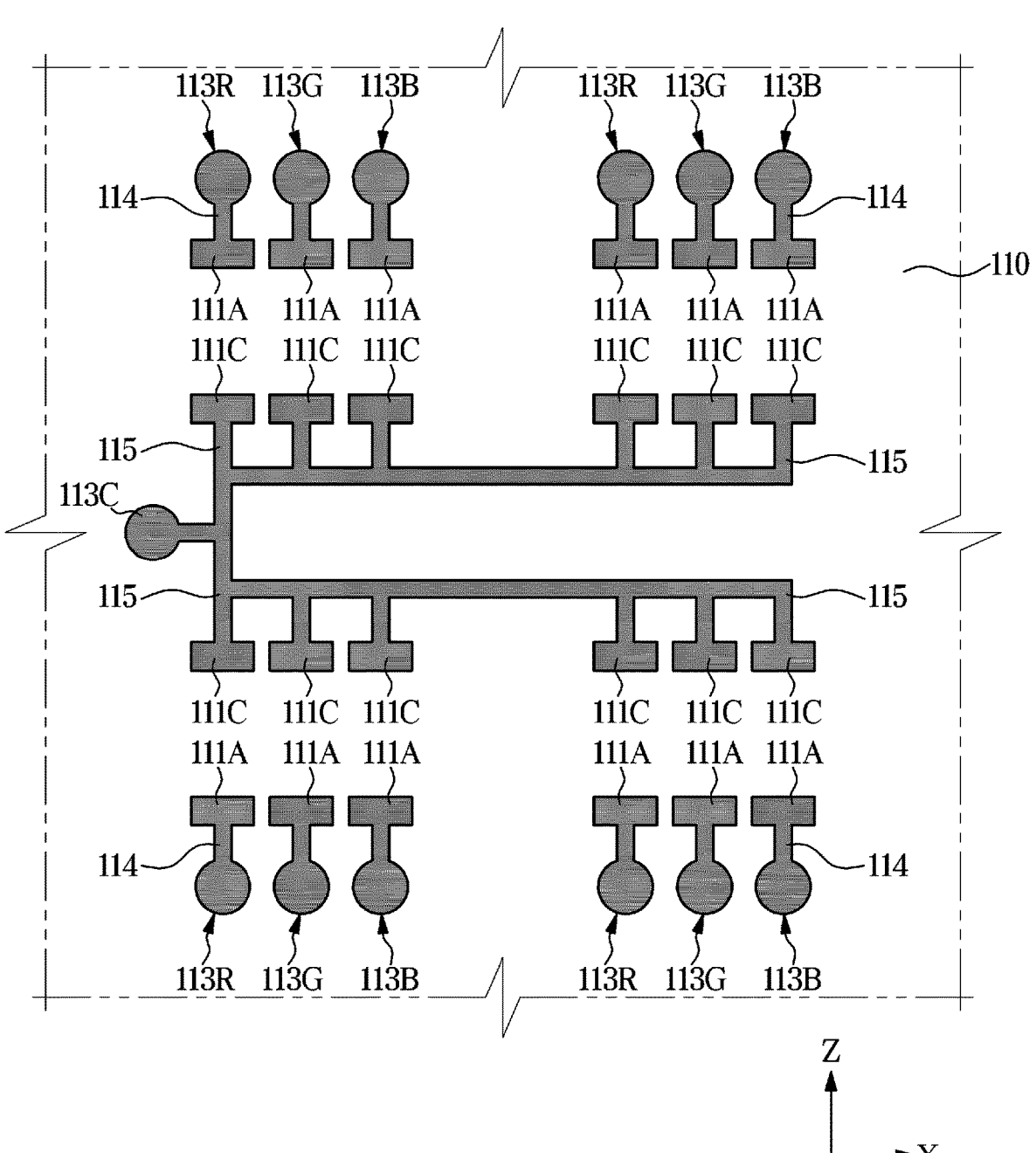
Figure 26:
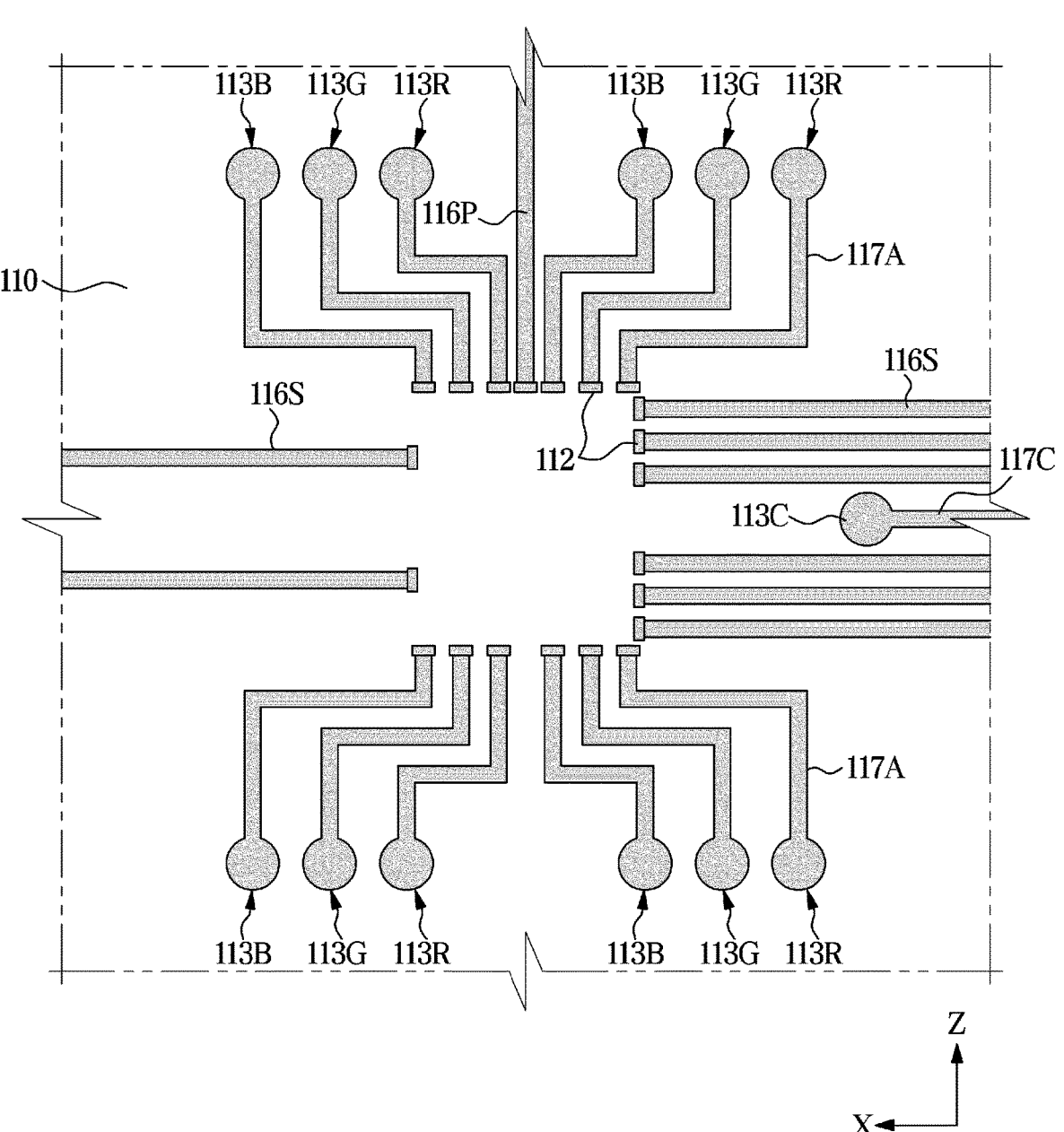

FIG. 24 shows a side cross section of the first substrate 110 on which an electrode pad is formed, FIG. 25 shows an upper surface of the first substrate 110 on which a wiring and an electrode pad are formed, and FIG. 26 shows a lower surface of the first substrate 110 on which a wiring and an electrode pad are formed.

As shown in FIG. 24, an upper wiring (not shown) and an upper electrode pad 111 may be formed on the upper surface of the first substrate 110 by the above-described process, and a lower wiring (not shown) and a lower electrode pad 112 may be formed on the lower surface of the first substrate 110.

Also, to electrically connect the upper wiring formed on the upper surface of the first substrate 110 with the lower wiring formed on the lower surface of the first substrate 110, the via hole wiring 113 or the side wiring 150 may be formed.

FIGS. 25 and 26 show examples of cases in which via hole wirings are formed. In a case in which a via hole wiring 113 is formed, a via hole may be formed in the first substrate 110, an inner wall of the formed via hole may be plated with a conductive material 113a such as copper, and then, the via hole may be filled with a filling material 113b through via filling. In this way, via hole wirings 113R, 113G, and 113B corresponding to the plurality of inorganic light-emitting devices 120R, 120G, and 120B may be formed.

To specifically describe a structure of the wiring, the electrode pad, and the via hole wiring formed by the above-described process, as shown in FIG. 25, anode pads 111A connected with the anodes 121 of the plurality of inorganic light-emitting devices 120 and cathode pads 111C connected with the cathodes 122 of the plurality of inorganic light-emitting devices 120 may be disposed on the upper surface of the first substrate 110.

The anode pads 111A may be connected with the via hole wirings 113R, 113G, and 113B by anode wirings 114 among the upper wirings of the first substrate 110. Driving current supplied from the micro pixel controller 130 may be supplied to the anodes 121 through the via hole wirings 113R, 113G, and 113B connected with the anode wirings 114.

A via hole wiring 113C for applying a common reference voltage $V_{SS}$ to the cathodes 122 may be formed in the first substrate 110, and the cathode pads 111C connected with the cathodes 122 of the inorganic light-emitting devices 120 may be connected with the via hole wiring 113C by cathode wirings 115 among the upper wirings of the first substrate 110. The reference voltage $V_{SS}$ supplied from the power board 601 may be supplied to the cathodes 122 through the via hole wiring 113C connected with the cathode wirings 115.

Referring to FIG. 26, a lower wiring 117A and a lower electrode pad 112 for electrically connecting the via hole wirings 113R, 113G, and 113B connected with the anodes 121 of the inorganic light-emitting devices 120R, 120G, and 120B with the micro pixel controller 130 may be formed on the lower surface of the first substrate 110.

Also, a lower wiring 117C for electrically connecting the via hole wiring 113C connected with the cathodes 122 of the inorganic light-emitting devices 120R, 120G, and 120B with the FPCB for supplying power may be formed on the lower surface of the first substrate 110.

Also, a lower wiring 116S for applying a gate signal or a data signal to the micro pixel controller 130 or a lower wiring 116P for applying a supply voltage Vim may be formed on the lower surface of the first substrate 11. The lower wirings 116S and 116P may be electrically connected with the driving board 501 or the power board 601 through the FPCB.

In a case in which the side wiring 150 is formed, an upper connection pad 141 may be formed at edge areas of the upper surface of the first substrate 110, and a lower connection pad 142 may be formed at edge areas of the lower surface of the first substrate 110. By applying a conductive material on one side surface of the first substrate 110, being adjacent to the upper connection pad 141 and the lower connection pad 142, by adopting an inkjet method, a stamping method, a screen printing method, a metal deposition method, an adhesion method using a tape, an etching method, etc., the side wiring 150 may be formed.

Accordingly, the plurality of inorganic light-emitting devices 120 disposed on the upper surface of the first substrate 110 may be electrically connected with the micro pixel controller 130 disposed on the lower surface of the first substrate 110 through the upper wirings, the upper connection pad 141, the side wiring 150, the lower connection pad 142, and the lower wirings.

Referring again to FIG. 23, inorganic light-emitting devices may be transferred to an upper surface of the module substrate on which the wiring and the electrode pad are formed (1020).

As described above, each inorganic light-emitting device 120 may be a micro LED. A micro LED on a wafer or a temporary substrate may be picked up by a transfer device, moved, and then transferred onto the first substrate 110. At this time, the inorganic light-emitting device 120 may be transferred such that the anode 121 and the cathode 122 are toward the upper surface of the first substrate 110. As a transfer method, any one of known techniques including a method using a laser, a method using a stamp, a method using a roller, etc. may be adopted.

Also, according to a method of connecting the inorganic light-emitting device 120 with the upper electrode pad 111, a soldering material or a conductive adhesive may be disposed or applied on the anode pads 111A and the cathode pads 111C formed on the upper surface of the first substrate 110.

Figure 27:
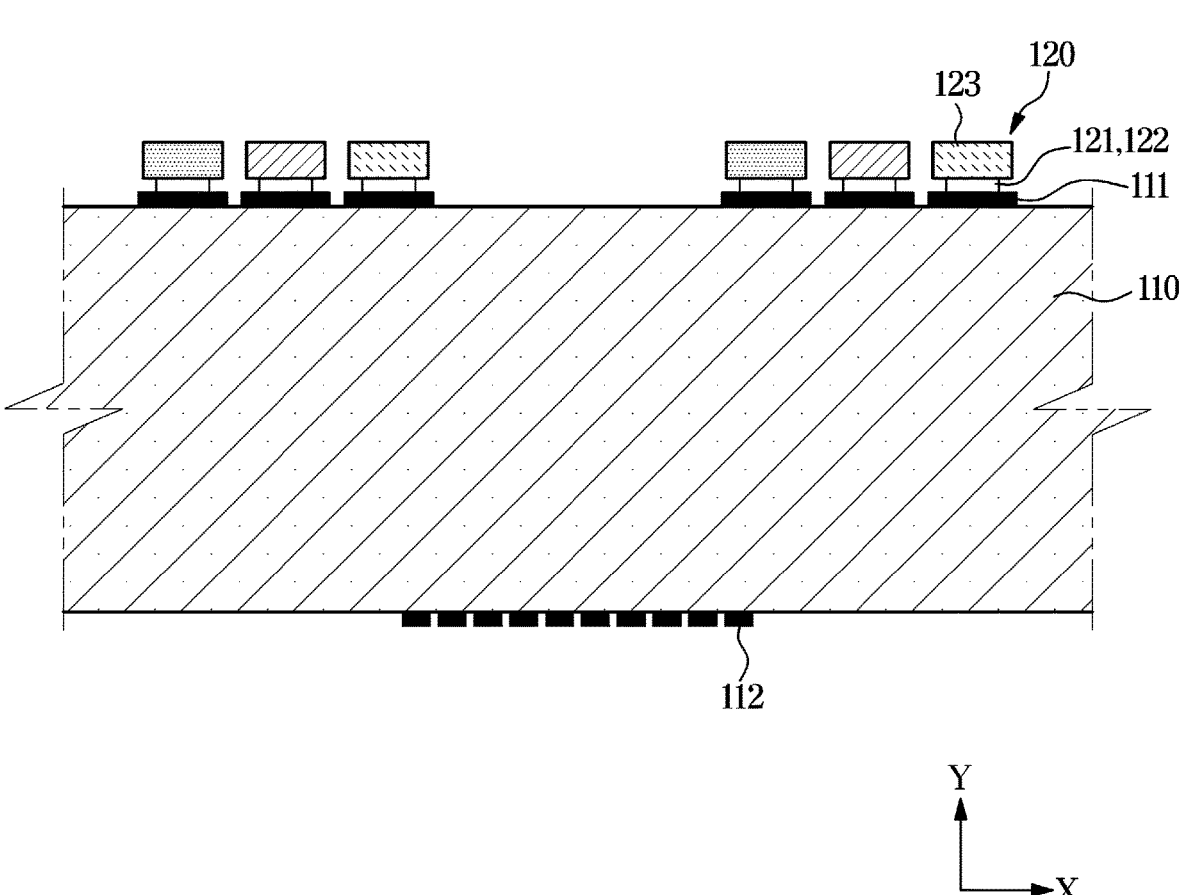

FIG. 27 shows a side cross section of the first substrate 110 to which inorganic light-emitting devices are transferred. By transferring the inorganic light-emitting devices 120 to the upper surface of the first substrate 110 on which the soldering material or the conductive adhesive is positioned or applied, as shown in FIG. 27, the anodes 121 of the inorganic light-emitting devices 120 may be electrically connected with the anode pads 111a, and the cathodes 122 of the inorganic light-emitting devices 120 may be electrically connected with the cathode pads 111C.

Referring again to FIG. 23, a micro pixel controller may be disposed on a lower surface of the module substrate on which the wiring and the electrode pad are formed (1030).

The micro pixel controller 130 may be manufactured by forming the pixel circuit 131 for controlling the inorganic light-emitting devices 120 on the second substrate 132, and a structure and operations of the micro pixel controller 130 have been described above in the embodiment of the display module 10.

Meanwhile, before micro pixel controllers 130 are mounted on the first substrate 110, circuit testing may be performed on each micro pixel controller 130, and only a micro pixel controller 130 identified as an adequate product by the circuit testing may be mounted on the first substrate 110. Accordingly, circuit testing and inadequate product replacement may be easy compared to a case in which a thin film transistor is mounted directly on a module substrate.

Figure 28:
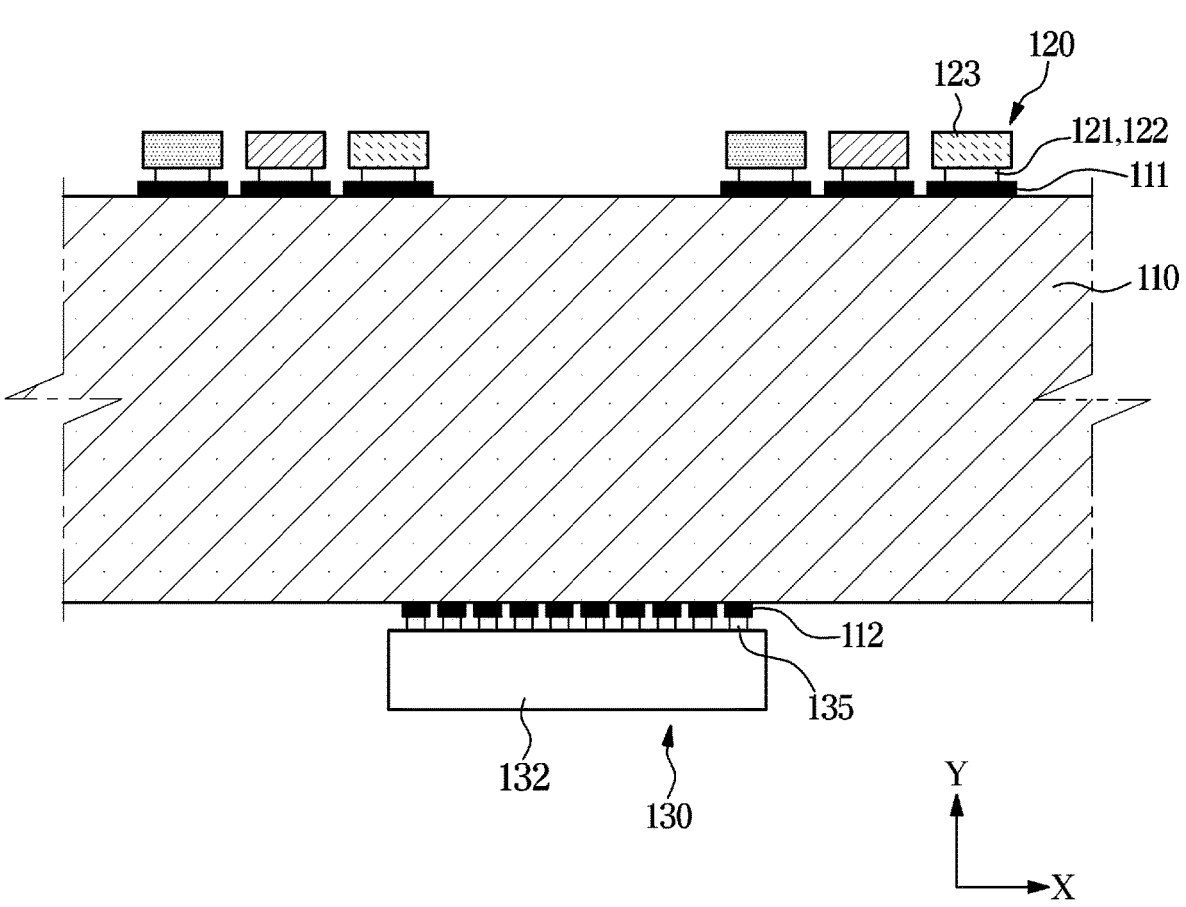

FIG. 28 shows a side cross section of the first substrate 110 on which a micro pixel controller is positioned. As shown in FIG. 28, by electrically connecting the contact pin 135 provided in the micro pixel controller 130 with the lower electrode pad 112 formed on the lower surface of the first substrate 110, the micro pixel controller 130 may be disposed on the first substrate 110. For example, the contact pin 135 may be electrically connected with the lower electrode pad 112 by soldering or a conductive adhesive.

Referring again to FIG. 23, a driver KC may be connected with the module substrate (1040).

The driver IC 200 may be connected with the first substrate 110 by adopting one of various bonding methods including Chip on Film (COF) or Film on Glass (FOG) bonding, Chip on Glass (COG) bonding, Tape Automated Bonding (TAB), etc.

Figure 29:
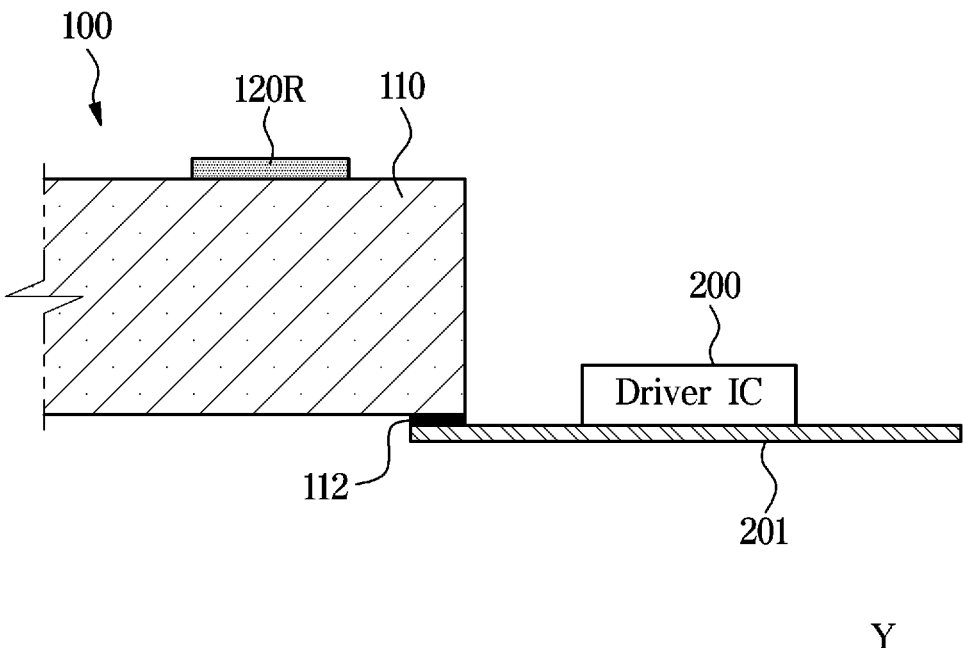

FIG. 29 shows a side cross section of the first substrate 110 connected with the driver IC 200. For example, in a case in which the COF bonding is adopted, as shown in FIG. 29, the driver IC 200 may be mounted on the film 201, and one end of the film 201 on which the driver IC 200 is mounted may be electrically connected with the first substrate 110.

For example, one end of the film 201 on which the driver IC 200 is mounted may be electrically connected with the lower electrode pad 112 provided on the lower surface of the first substrate 110, and the lower electrode pad 112 electrically connected with the film 201 on which the driver IC 200 is mounted may be connected with a lower wiring extending from the micro pixel controller 130. The micro pixel controller 130 may receive a gate signal and a data signal from the driver IC 200 through the corresponding lower wiring.

Referring again to FIG. 23, a FPCB may be connected with the module substrate (1050).

Figure 30:
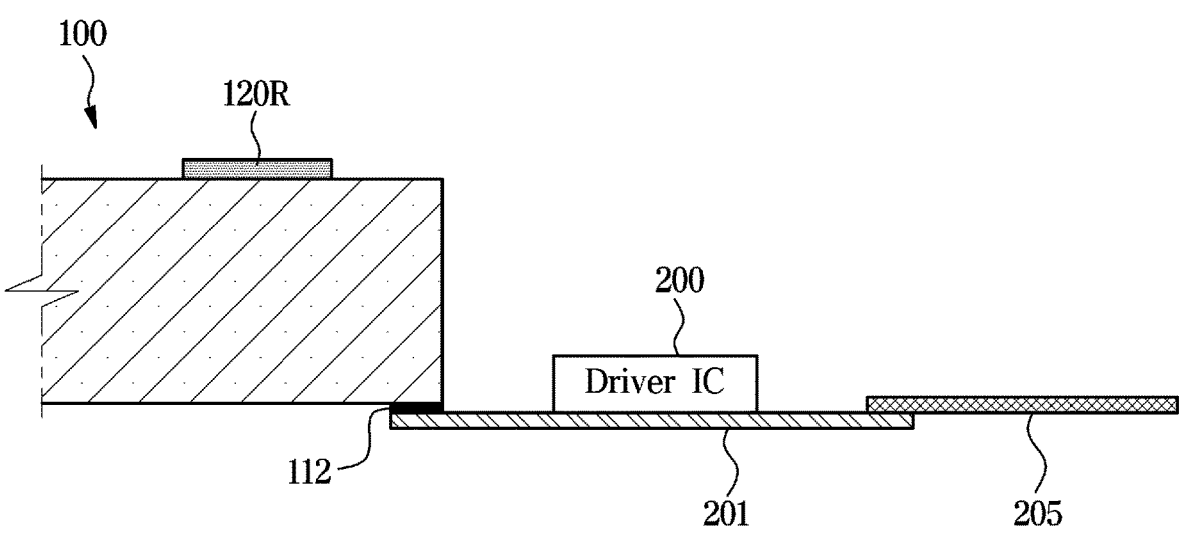
Figure 30:
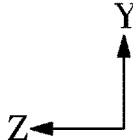

FIG. 30 shows a side cross section of the first substrate 110 connected with the FPCB 205. Like the above-described example, in a case in which the COF bonding is adopted, as shown in FIG. 30, the other end of the film 201 on which the driver IC 200 is mounted may be electrically connected with the FPCB 205.

The FPCB 205 connected with the film 201 on which the driver IC 200 is mounted may be electrically connected with the driving board 501 to transfer a timing control signal, image data, etc. output from the driving board 501 to the driver IC 200.

Also, the first substrate 110 may be connected with the FPCB to receive power, and the FPCB for supplying power may be electrically connected with the power board 601 to supply a supply voltage Vim or a reference voltage $V_{SS}$ to the micro pixel controller 130 or the inorganic light-emitting devices 120.

Meanwhile, the method for manufacturing the display module according to an embodiment may include all or some of the above-described processes. Also, another process may be added.

For example, the process 1010 of forming the wiring and the electrode pad on the module substrate may be omitted, the process 1010 of forming the wiring and the electrode pad on the module substrate and the process 1020 of transferring the inorganic light-emitting devices to the module substrate may be omitted, or the process 1040 of connecting the driver IC and the process 1050 of connecting the FPCB may be omitted.

The above detailed description provides examples of the present disclosure. In addition, the above description explains by showing preferred embodiments of the present disclosure, and the present disclosure may be used in various different combinations, changes and environments. That is, the present disclosure may be modified or changed within the scope of the spirit of the present disclosure disclosed in this specification, within a scope equivalent to the disclosed contents, and/or within the scope of the technique(s) or knowledge of the related art. The above embodiments describe the best conditions for implementing the technical spirit of the present disclosure, and various changes in the specific application fields and usages of the present disclosure also can be made. Accordingly, the detailed description of the present disclosure as described above shows disclosed embodiments and is not intended to limit the present disclosure. In addition, the appended claims should be interpreted as also including other embodiments.

What is claimed is:

1. A display module comprising a plurality of pixels, comprising:
   a first substrate;
   a plurality of inorganic light-emitting devices disposed on an upper surface of the first substrate;
   a plurality of micro pixel controllers disposed on a lower surface of the first substrate; and
   a driver integrated chip configured to transfer a driving signal to the plurality of micro pixel controllers,
   wherein each of the plurality of pixels comprises two or more inorganic light-emitting devices among the plurality of inorganic light-emitting devices,
   wherein each of the plurality of micro pixel controllers is configured to control two or more pixels of the plurality of pixels,
   wherein each of the plurality of micro pixel controllers has a length of a shorter side that is longer than a distance between adjacent inorganic light-emitting devices in different pixels among the pixels controlled by the micro pixel controller.

2. The display module of claim 1, wherein each of the plurality of micro pixel controllers is configured to switch the plurality of inorganic light-emitting devices and supply driving current to the plurality of inorganic light-emitting devices.

3. The display module of claim 1, wherein each of the plurality of micro pixel controllers comprises:
   a second substrate; and
   at least one thin film transistor disposed on the second substrate,
   wherein each of the thin film transistors is configured to switch the plurality of inorganic light-emitting devices and supply driving current to the plurality of inorganic light-emitting devices.

4. The display module of claim 3, wherein each of the thin film transistor comprises a Low Temperature Polycrystalline Silicon thin film transistor.

5. The display module of claim 4, wherein the first substrate comprises a glass substrate, and the second substrate comprises a silicon substrate.

6. The display module of claim 1, wherein a distance between adjacent pixels among the plurality of pixels are a same length.

7. The display module of claim 6, wherein each of the plurality of micro pixel controllers is disposed such that at least one part of the plurality of inorganic light-emitting devices overlaps at least one part of the micro pixel controller in an up-down direction.

8. The display module of claim 1, wherein each of the plurality of pixels comprises at least three sub pixels that each output different colors of light.

9. The display module of claim 1, wherein each of the plurality of pixels comprises a red inorganic light-emitting device, a green inorganic light-emitting device, and a blue inorganic light-emitting device among the plurality of inorganic light-emitting devices.

10. The display module of claim 1, wherein each of the plurality of micro pixel controllers is electrically connected with a plurality of inorganic light-emitting devices.

11. The display module of claim 10, wherein each of the plurality of micro pixel controllers is electrically connected with the plurality of inorganic light-emitting devices through at least one of a via hole wiring or a side wiring.

12. A display device comprising:

a plurality of display modules comprising a plurality of pixels arranged two-dimensionally; and a frame supporting the plurality of display modules, wherein each of the plurality of display modules comprises:

a first substrate;

a plurality of inorganic light-emitting devices disposed on an upper surface of the first substrate;

a plurality of micro pixel controllers disposed on a lower surface of the first substrate; and a driver integrated chip (IC) configured to transfer a driving signal to the plurality of micro pixel controllers, wherein each of the plurality of pixels comprises two or more inorganic light-emitting devices among the plurality of inorganic light-emitting devices, wherein each of the plurality of micro pixel controllers controls two or more pixels among the plurality of pixels, and wherein each of the plurality of micro pixel controllers has a length of a shorter side that is longer than a distance between adjacent inorganic light-emitting devices in different pixels among the pixels controlled by the micro pixel controller.

13. The display device of claim 12, wherein each of the plurality of micro pixel controllers is configured to switch a plurality of inorganic light-emitting devices and supply driving current to the plurality of inorganic light-emitting devices.

14. The display device of claim 12, wherein each of the plurality of micro pixel controllers comprises:

a second substrate; and at least one thin film transistor disposed on the second substrate, and wherein each of the thin film transistors is configured to switch a plurality of inorganic light-emitting devices and supply driving current to the plurality of inorganic light-emitting devices.

15. The display device of claim 14, wherein each of the thin film transistor comprises a Low Temperature Polycrystalline Silicon thin film transistor.

* * * * *